(12) United States Patent
Kataoka

(10) Patent No.: US 11,728,750 B2
(45) Date of Patent: Aug. 15, 2023

(54) VIBRATION ACTUATOR HAVING PLURAL VIBRATORS AND INDUCTORS

(71) Applicant: CANON KABUSHIKI KAISHA, Tokyo (JP)

(72) Inventor: Kenichi Kataoka, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 474 days.

(21) Appl. No.: 16/825,201

(22) Filed: Mar. 20, 2020

(65) Prior Publication Data
US 2020/0313573 A1    Oct. 1, 2020

(30) Foreign Application Priority Data
Mar. 26, 2019    (JP) ................. 2019-058725

(51) Int. Cl.
| | | |
|---|---|---|
| H02N 2/02 | (2006.01) | |
| H02N 2/00 | (2006.01) | |
| H02N 2/12 | (2006.01) | |
| H02N 2/14 | (2006.01) | |
| H10N 30/40 | (2023.01) | |
| H10N 30/20 | (2023.01) | |

(52) U.S. Cl.
CPC ............ H02N 2/026 (2013.01); H02N 2/004 (2013.01); H02N 2/12 (2013.01); H02N 2/142 (2013.01); H10N 30/2023 (2023.02); H10N 30/40 (2023.02)

(58) Field of Classification Search
CPC .......... H02N 2/026; H02N 2/004; H02N 2/12; H02N 2/142; H02N 2/145; H02N 2/0015; H02N 2/103; H02N 2/123; H02N 2/163; H02N 2/0065; H02N 2/147; H02N 2/0075; H02N 2/06; H01L 41/093; H01L 41/107
See application file for complete search history.

(56) References Cited

U.S. PATENT DOCUMENTS

| | | | |
|---|---|---|---|
| 5,285,134 A | 2/1994 | Kataoka | |
| 7,532,084 B2 * | 5/2009 | Wada ........................ | H01P 1/36 333/24.2 |
| 7,557,488 B2 * | 7/2009 | Yamaguchi ............. | H02M 1/44 310/318 |
| 7,646,136 B2 | 1/2010 | Adachi et al. | |

(Continued)

FOREIGN PATENT DOCUMENTS

| | | |
|---|---|---|
| EP | 3 051 599 A1 | 8/2016 |
| JP | 2008-278712 A | 11/2008 |

(Continued)

OTHER PUBLICATIONS

Office Action dated Aug. 30, 2021, in European Patent Application No. 20 165 512.3.

(Continued)

*Primary Examiner* — Emily P Pham
(74) *Attorney, Agent, or Firm* — Venable LLP

(57) ABSTRACT

A vibration actuator that is capable of reducing difference of vibration velocities when a contact member is driven using a plurality of vibrators includes a vibrator device and the contact member, which moves relative to the vibrator device. The vibrator device includes the plurality of vibrators, which are connected in series, and a plurality of inductors, which are connected in parallel to the respective vibrators.

18 Claims, 25 Drawing Sheets

(56) References Cited

U.S. PATENT DOCUMENTS

| | | | |
|---|---|---|---|
| 7,732,978 B2* | 6/2010 | Suzuki | H01L 41/042 |
| | | | 310/317 |
| 10,298,207 B2* | 5/2019 | Freisleben | H03H 9/568 |
| 10,615,328 B2* | 4/2020 | Kajino | H01L 41/09 |
| 10,644,617 B2 | 5/2020 | Kataoka | |
| 2004/0108824 A1* | 6/2004 | Ueda | H02P 25/032 |
| | | | 318/114 |
| 2005/0049525 A1* | 3/2005 | Yamada | A61B 17/2202 |
| | | | 601/2 |
| 2008/0278033 A1 | 11/2008 | Adachi et al. | |
| 2009/0045696 A1 | 2/2009 | Suzuki | |
| 2011/0227426 A1* | 9/2011 | Lee | H02K 33/18 |
| | | | 310/25 |
| 2011/0298400 A1* | 12/2011 | Kudo | H02N 2/062 |
| | | | 318/116 |
| 2011/0304933 A1* | 12/2011 | Uchiyama | H02N 2/103 |
| | | | 318/116 |
| 2016/0049572 A1* | 2/2016 | Hashimoto | H02N 2/004 |
| | | | 310/317 |
| 2016/0329837 A1* | 11/2016 | Kataoka | A61B 5/0263 |
| 2017/0019601 A1* | 1/2017 | Sumioka | H02N 2/06 |
| 2017/0279029 A1* | 9/2017 | Miyamoto | H02N 2/142 |
| 2018/0090668 A1 | 3/2018 | Miyazawa | |
| 2018/0360452 A1* | 12/2018 | Shelton, IV | A61B 17/1114 |

FOREIGN PATENT DOCUMENTS

| | | |
|---|---|---|
| JP | 2017-104014 A | 6/2017 |
| WO | 2014/098244 A1 | 6/2014 |
| WO | 2015/174039 A1 | 11/2015 |

OTHER PUBLICATIONS

Extended European Search Report dated Aug. 3, 2020, in European Patent Application No. 20165512.3.

Satonobu, et al., "Electrical Series Connection Drive for Several Hybrid-Transducer Ultrasonic Motors," Electronics and Communications in Japan, Part 3, vol. 81, No. 12, 1998, pp. 11-22.

U.S. Appl. No. 16/846,982, Kenichi Kataoka, filed Apr. 13, 2020.

* cited by examiner

VIBRATION ACTUATOR HAVING PLURAL VIBRATORS AND INDUCTORS

BACKGROUND OF THE INVENTION

Field of the Invention

The present invention relates to a vibration actuator and a driving device for the vibration actuator.

Description of the Related Art

There is a known conventional mechanism that drives a contact member using a plurality of vibrators. The plurality of vibrators employ electro-mechanical energy conversion elements, such as piezoelectric devices and electrostriction elements, and are driven by a common drive circuit. This reduces a circuit structure as compared with a case where individual drive circuits are respectively installed for the plurality of vibrators. As a related technique, a vibration driving device in which three plate-shaped vibrators are arranged at angular intervals of 120 degrees so as to drive a ring-shape driven body is proposed (see Japanese Laid-Open Patent Publication (Kokai) No. 2017-104014 (JP 2017-104014A)). Moreover, a driving device in which two piezoelectric devices arranged on a straight line drive a tabular single movable body is proposed (see Japanese Laid-Open Patent Publication (Kokai) No. 2008-278712 (JP 2008-278712A)).

The vibrators of the vibration driving device of JP 2017-104014A are connected in parallel. Accordingly, since the vibrators vibrate at different amplitudes and phases because of difference in the resonance frequencies of the respective vibrators, sliding loss occurs between the vibrators and the contact member according to the vibration velocity difference between the respective vibrators. If the resonance frequencies of the vibrators are made uniform when manufacturing the vibration driving device of JP 2017-104014A, the sliding loss is reduced to some extent. However, this needs the operation to select vibrators according to the frequency and cannot eliminate the difference of the vibration velocities of the respective vibrators due to the difference in load.

In the meantime, the vibrators of the driving device of JP 2008-278712A are connected in series. Accordingly, the vibrators connected in series vibrate as one resonance system. Accordingly, vibration phases of the vibrators are made uniform to some extent. And since a balance of applied voltage depends on the amount of load, the sliding loss becomes small. However, since the resonance frequencies of the vibrators depend on the load, the difference of the vibration velocities of the vibrators cannot be eliminated.

SUMMARY OF THE INVENTION

The present invention provides a vibration actuator and a driving device therefor that are capable of reducing difference of vibration velocities when a contact member is driven using a plurality of vibrators.

Accordingly, a first aspect of the present invention provides a vibration actuator including a vibrator device and a contact member that moves relative to the vibrator device. The vibrator device includes a plurality of vibrators that are connected in series, and a plurality of inductors that are connected in parallel to the respective vibrators.

Accordingly, a second aspect of the present invention provides a driving device for the vibration actuator of the first aspect, the driving device including a drive signal generator that generates an alternating voltage applied to the vibrator device, an amplitude detector that detects amplitude of an electric current flowing to the vibrator device, and a drive signal controller that controls the alternating voltage that the drive signal generator generates according to the amplitude of the electric current.

According to the present invention, the difference of the vibration velocities of the vibrators when the contact member is driven using a plurality of vibrators can be reduced.

Further features of the present invention will become apparent from the following description of exemplary embodiments with reference to the attached drawings.

DESCRIPTION OF THE EMBODIMENTS

Figure 1A:
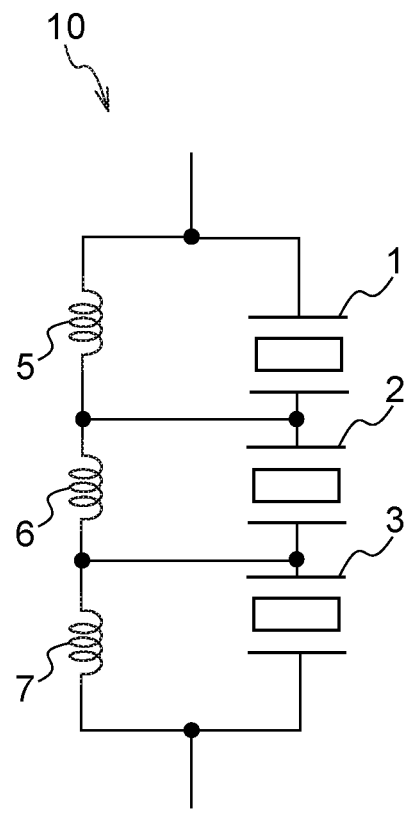
FIG. 1A and FIG. 1B are views showing an example of a configuration of a vibrator device concerning a first embodiment.

Hereafter, embodiments according to the present invention will be described in detail by referring to the drawings. Configurations described in the following embodiments are only examples, and the scope of the present invention is not limited by the configurations described in the embodiments.

Figure 1B:
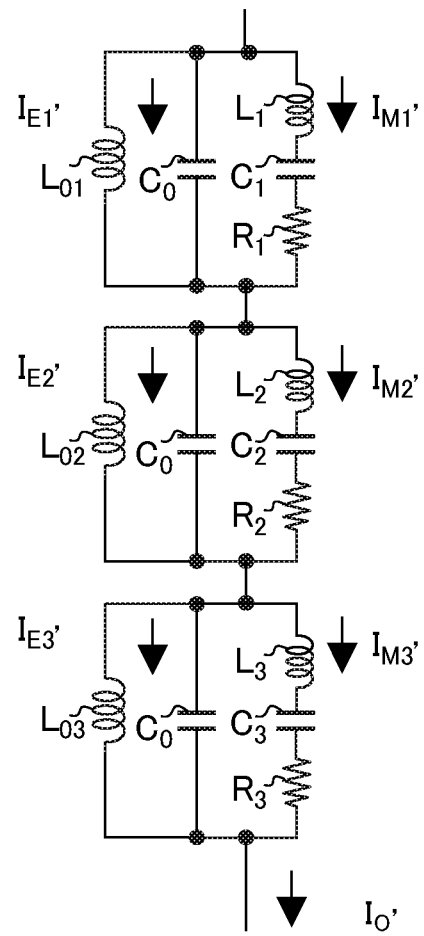

FIG. 1A and FIG. 1B are views showing an example of a configuration of a vibrator device 10 concerning a first embodiment. The vibrator device 10 contacts a contact member and moves relative to the contact member. Thereby, the vibrator device 10 drives the contact member. FIG. 1A shows a circuit configuration in which three vibrators 1, 2, and 3 are connected in series. Piezoelectric members, electrostriction elements, etc. that are electric-mechanical energy conversion means are joined to the vibrators 1, 2, and 3. Hereinafter, the following description assumes that a piezoelectric member is joined to each of the vibrators. FIG. 1B is an equivalent circuit diagram of the vibrator device 10 in FIG. 1A.

As shown in FIG. 1A and FIG. 1B, inductors are respectively connected in parallel to the vibrators 1, 2, and 3. In the example of FIG. 1A, an inductor 5 is connected in parallel to the vibrator 1, an inductor 6 is connected in parallel to the vibrator 2, and an inductor 7 is connected in parallel to the vibrator 3. Moreover, the inductor 5, the inductor 6, and the inductor 7 are connected in series. Although this embodiment describes the case where the piezoelectric members are joined to the vibrators 1, 2, and 3, the vibrators 1, 2, and 3 themselves may be configured by piezoelectric members. Moreover, a piezoelectric member may be a lamination piezoelectric member. The number of the vibrators of the vibrator device 10 and the number of inductors are not limited to three.

Figure 2A:
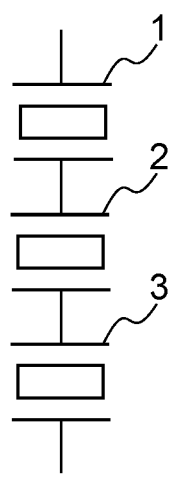
FIG. 2A and FIG. 2B are views showing an example of a configuration of a vibrator device of a comparative example.
Figure 2B:
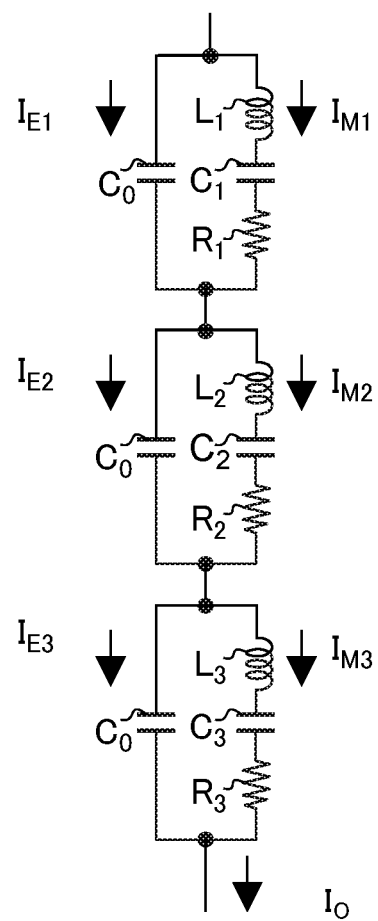

Next, an example of a vibrator device of a comparative example will be described. FIG. 2A and FIG. 2B are views showing the example of a configuration of the vibrator device of the comparative example. As shown in FIG. 2A, the vibrator device of the comparative example is configured by connecting three vibrators 1, 2, and 3 to which piezoelectric members are joined in series. No inductor is connected in parallel to the vibrators 1, 2, and 3.

FIG. 2B is an equivalent circuit diagram of FIG. 2A, and a circuit that consists of C0, L1, C1, and R1 indicates the equivalent circuit of the vibrator 1. A circuit that consists of C0, L2, C2, and R2 indicates the equivalent circuit of the vibrator 2. A circuit that consists of C0, L3, C3, and R3 indicates the equivalent circuit of the vibrator 3. The damping capacitance C0 of each equivalent circuit indicates the electric characteristic of the piezoelectric member that is joined to each of the vibrators 1, 2, and 3. The series resonant circuits that consist of Lx, Cx, and Rx (x is an integer of 1 to 3) indicates mechanical characteristics of the vibrators 1, 2, and 3. Reference symbols IE1, IE2, and IE3 show values of electric currents that flow through the damping capacitances C0 of the vibrators 1, 2, and 3. Reference symbols IM1, IM2, and IM3 show values of electric currents that flow through the series resonant circuits (Lx, Cx, and Rx) of the vibrators 1, 2, and 3. Then, a value of an electric current Io becomes equal to "IE1+IM1", "IE2+IM2", and "IE3+IM3".

Figure 3A:
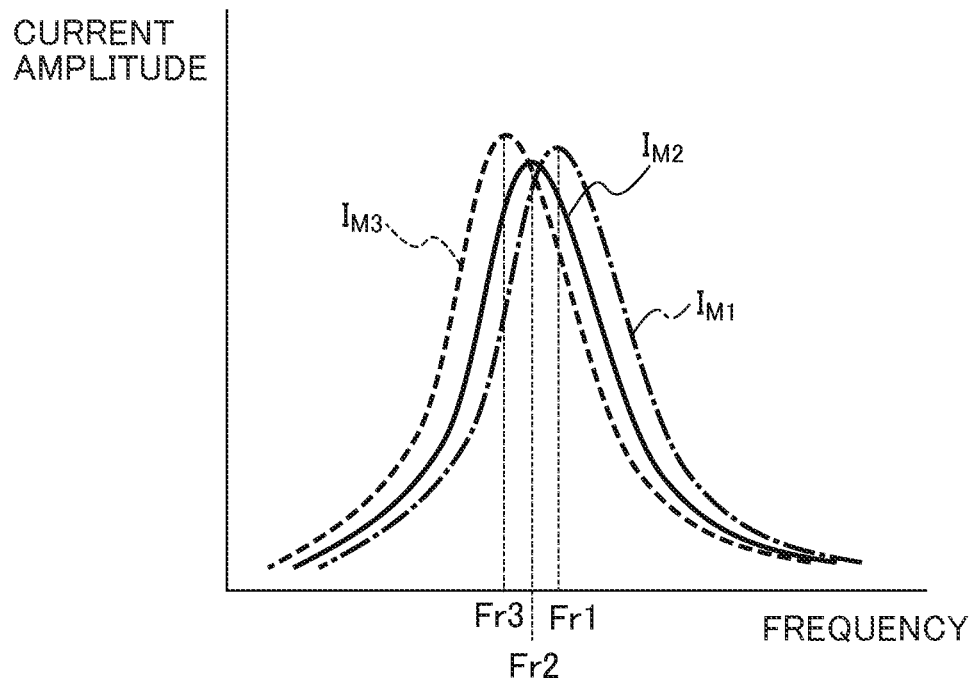
FIG. 3A and FIG. 3B are graphs showing electric current amplitude characteristics with respect to a frequency corresponding to the configuration of FIG. 2A and FIG. 2B.
Figure 3B:
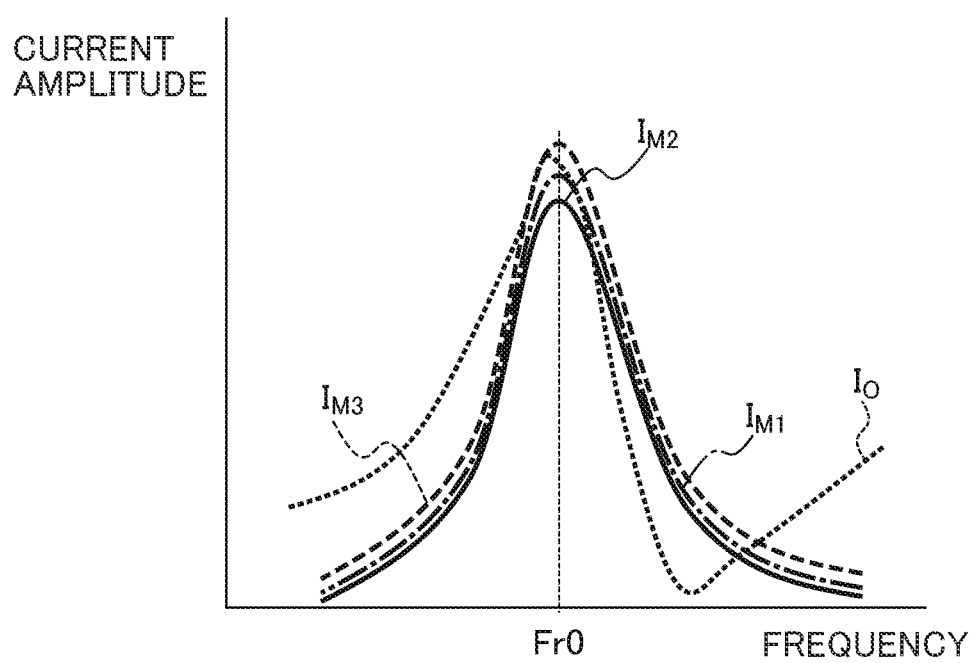

FIG. 3A and FIG. 3B are graphs showing electric current amplitude characteristics with respect to a frequency corresponding to the configuration of FIG. 2A and FIG. 2B. FIG. 3A is the graph showing electric current amplitude characteristics with respect to a frequency in cases where the same alternating voltages are applied to the vibrators 1, 2, and 3. The vibrators 1, 2, and 3 have the electric current amplitude characteristics in which the amplitudes are maximized at different resonance frequencies Fr1, Fr2, and Fr3. FIG. 3B is the graph showing the amplitudes of the electric currents IM1 (an alternate long and short dash line), IM2 (a solid line), IM3 (a broken line), and Io (a dotted line) with respect to the frequency of the alternating voltage applied to the series resonant circuits (Lx, Cx, and Rx) in FIG. 2B.

As shown in FIG. 3B, when the alternating voltages are applied to the series resonant circuits (Lx, Cx, and Rx) in FIG. 2B, the amplitudes of the electric currents IM1, MI2, and IM3 that represent vibration velocities of the vibrators 1, 2, and 3 are maximized at the resonance frequency Fr0. However, the maximum amplitudes of the respective electric currents are different. When the maximum amplitudes of the electric currents of the vibrators 1, 2, and 3 differ at the resonance frequency Fr0, the vibration velocities of the vibrators 1, 2, and 3 differ. When the vibrators 1, 2, and 3 press the contact member to drive in the state where the vibration velocities of the vibrators 1, 2, and 3 differ, sliding amounts at the contact positions of the contact member differ. When the sliding amounts differ, loss that does not contribute to the driving occurs, which reduces driving efficiency of the contact member. Moreover, as shown in FIG. 3B, the variation of the electric current Io that flows through the vibrator device 10 differs from the variations of the electric currents IMx (x is an integer of 1 to 3) greatly. Accordingly, it is difficult to accurately detect the amounts of the electric currents IMx by detecting the electric current Io.

In light of the above problem, in this embodiment, as shown in FIG. 1B, the inductors L01, L02, and L03 are respectively connected in parallel to the damping capacitances C0 of the vibrators 1, 2, and 3. Each inductor connected in parallel to the damping capacitance C0 resonates in parallel at a predetermined frequency. Accordingly, the amounts of the electric currents IEx' (x is an integer of 1 to 3) that flow through the parallel circuits that consist of the inductors L0x (x is an integer of 1 to 3) and the damping capacitances C0 approach zero. When the electric currents IEx' become about zero, the electric currents IMx'+IEx' (x is an integer of 1 to 3) become approximately equal to the electric currents IMx'. Accordingly, the electric current Io' that flows through the vibrator device 10 shown in FIG. 1A becomes approximately equal to the electric currents IMx'.

Figure 4:
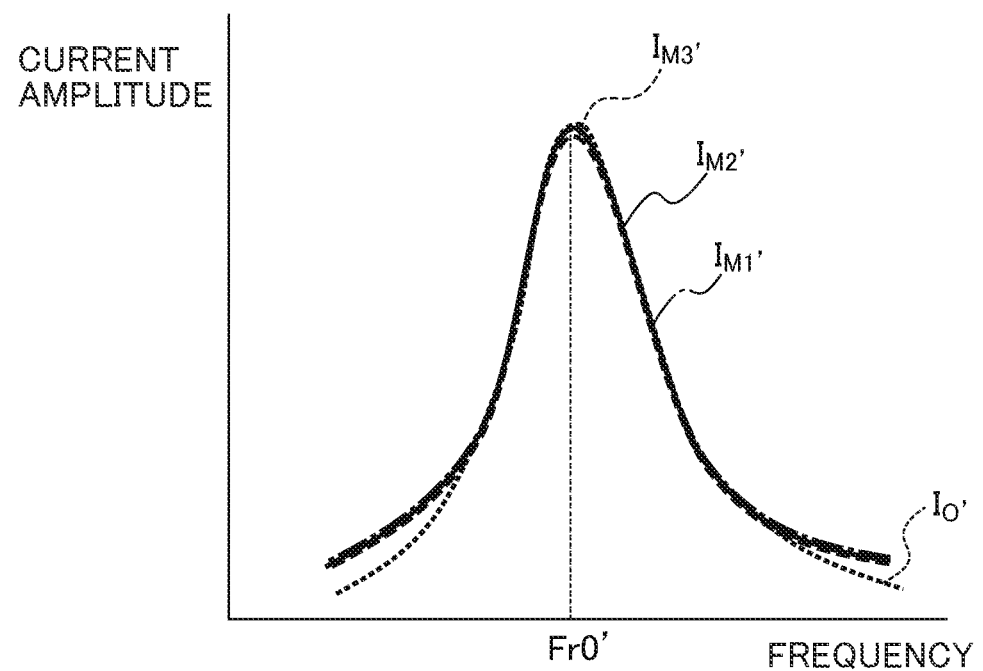
FIG. 4 is a graph showing amplitude of electric current with respect to a frequency of an alternating voltage applied to the series circuit of FIG. 1B.

FIG. 4 is a graph showing the amplitudes of the electric currents IMP (an alternate long and short dash line), IM2' (a solid line), IM3' (a broken line), and Io' (a dotted line) with respect to the frequency of the alternating voltage applied to the series resonant circuits (Lx, Cx, and Rx) in FIG. 1B. The amplitudes of the electric currents IMP, IM2', and IM3' are approximately equal and are maximized at the same resonance frequency Fr0'. The resonance frequency Fr0' is approximately equal to an average value of the resonance frequency Fr1 of the vibrator 1, the resonance frequency Fr2 of the vibrator 2, and the resonance frequency Fr3 of the vibrator 3. Moreover, the amplitude of the electric current Io' becomes approximately equal to the amplitudes of the electric currents IMx' in a frequency range in which the amplitudes are more than a predetermined value.

This embodiment employs the configuration in which the inductors are connected in parallel to the respective vibrators connected in series. Accordingly, since the above-mentioned electric currents IMx'+IEx' are approximately equal to the electric currents IMx', the amplitudes and phases of the vibrators 1, 2, and 3 are made uniform even if the plurality of vibrators are vibrated with one drive voltage. This is capable of reducing the difference between the vibration velocities of the vibrators and is capable of transferring the forces generated by the respective vibrators to one contact member at a sufficient efficiency. Moreover, the contact member can be driven with the high thrust using the plurality of vibrators.

Figure 5A:
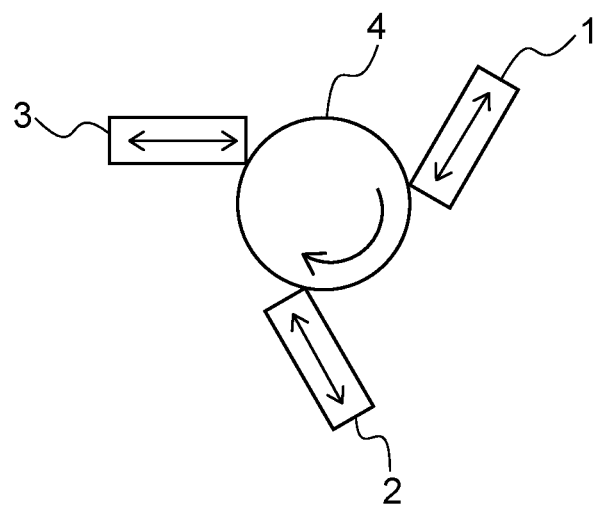
FIG. 5A is a view showing a configuration of a vibration actuator that rotates a cylindrical shaft.
Figure 5B:
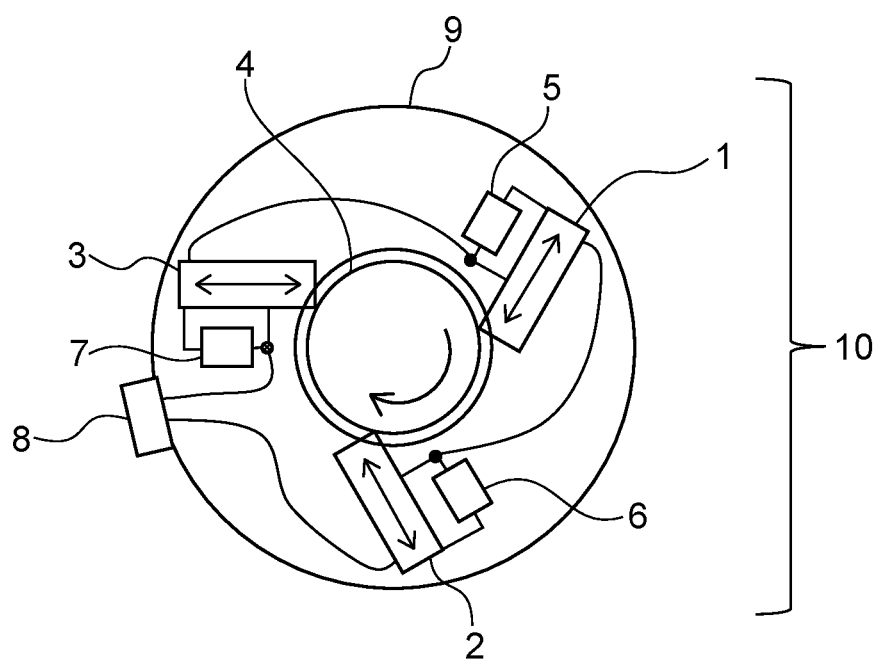
FIG. 5B is a view showing an electric connection relation thereof.

FIG. 5A is a view showing a configuration of the vibration actuator that contacts the vibrators 1, 2, and 3 around the cylindrical shaft 4 to rotate the cylindrical shaft 4. FIG. 5B is a view showing the electric connection relation thereof. FIG. 5A is a view showing the configuration of the vibration actuator that rotates the cylindrical shaft 4. The vibrators 1, 2, and 3 vibrate in a vertical direction (a direction of an arrow). The cylindrical shaft 4 is an example of a contact member and is driven by the vibrators 1, 2, and 3. The vibrators 1, 2, and 3 are arranged around the cylindrical shaft 4 at nearly equal intervals of 120 degrees. Then, the vibrators 1, 2, and 3 press the cylindrical shaft 4 equally by pressure mechanisms (not shown). In the example of FIG. 5A and FIG. 5B, the cylindrical shaft 4 is rotated clockwise by vibrations in the vertical direction that are excited by the vibrators 1, 2, and 3.

FIG. 5B is a view showing the electric connection relation in the vibrator device 10. The inductors 5, 6, and 7 are connected in parallel to the piezoelectric members joined to the vibrators 1, 2, and 3, respectively. The vibrator device 10 is provided with a connector 8 to input an alternating voltage. The vibrators 1, 2, and 3 are connected in series and both sides of a series circuit of the vibrators are connected to the connector 8.

The vibrators 1, 2, and 3, the cylindrical shaft 4, and the inductors 5, 6, and 7 are stored in a ring-shape casing 9, and these are united to constitute the vibrator device 10. Moreover, the vibrators 1, 2, and 3 have projection members that press the cylindrical shaft 4 that passes a hollow cylindrical part of the casing 9. The projection members are arranged at angular intervals of 120 degrees in the hollow cylindrical part. Each of the projection members is pressed to the cylindrical shaft 4 by a support member including a spring structure (not shown) at a fixed pressure. Moreover, the projection amount and pressure of each projection member are adjustable by a rotation-linear motion conversion mechanism that is provided in the casing 9.

Figure 6:
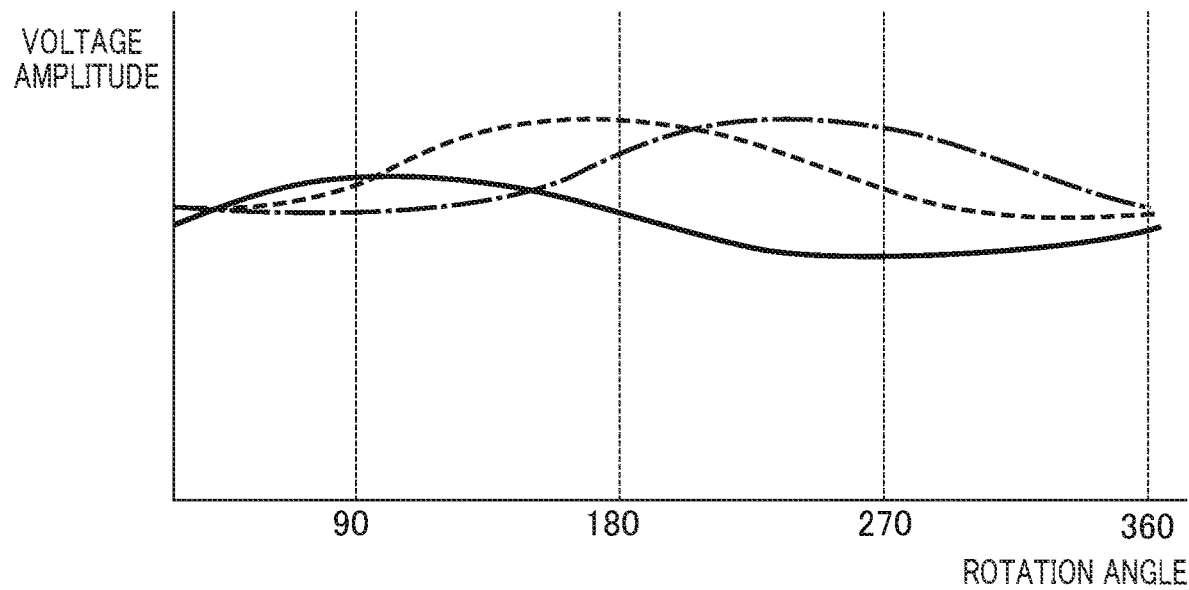
FIG. 6 is a graph showing relationships between a rotation angle and amplitudes of alternating voltages applied to the respective vibrators when the cylindrical shaft shown in FIG. 5A is driven to rotate.

FIG. 6 is a graph showing relationships between a rotation angle and amplitudes of alternating voltages applied to the respective vibrators 1, 2, and 3 when the cylindrical shaft 4 is driven by applying the alternating voltages to the vibrator device 10. Load fluctuation of one cycle occurs in synchronization with the rotation of the cylindrical shaft 4 because of load fluctuation under the influence of decentering of the cylindrical shaft 4. Accordingly, the voltage amplitude increases with increasing of the load, and the voltage amplitude decreases with decreasing of the load.

Since the vibrators 1, 2, 3 are arranged around the cylindrical shaft 4 at the nearly equal intervals of about 120 degrees, rotation phases of the three waveforms (waveforms showing the voltage amplitudes of the vibrators 1, 2, and 3) in FIG. 6 are shifted by about 120 degrees. Moreover, the averages of the voltage amplitudes of the vibrators 1, 2, and 3 during the rotation of the cylindrical shaft 4 are different from each other. This is mainly attributed to difference in internal loss and/or resonance frequency between the vibrators 1, 2, and 3.

As mentioned above, since the vibrator device 10 of this embodiment includes the inductors connected in parallel to the respective vibrators 1, 2, and 3, the amplitudes and phases of the electric currents flowing through the vibrators 1, 2, and 3 are made uniform, which reduces the difference of the vibration velocities of the vibrators. Thereby, even if a difference in the resonance frequency occurs between the vibrators 1, 2, and 3 or the load fluctuation occurs, the amplitudes of the alternating voltages applied are automatically adjusted. As a result, the vibration velocities of the vibrators 1, 2, and 3 are made uniform and the cylindrical shaft 4 can be driven at high efficiency.

Figure 7:
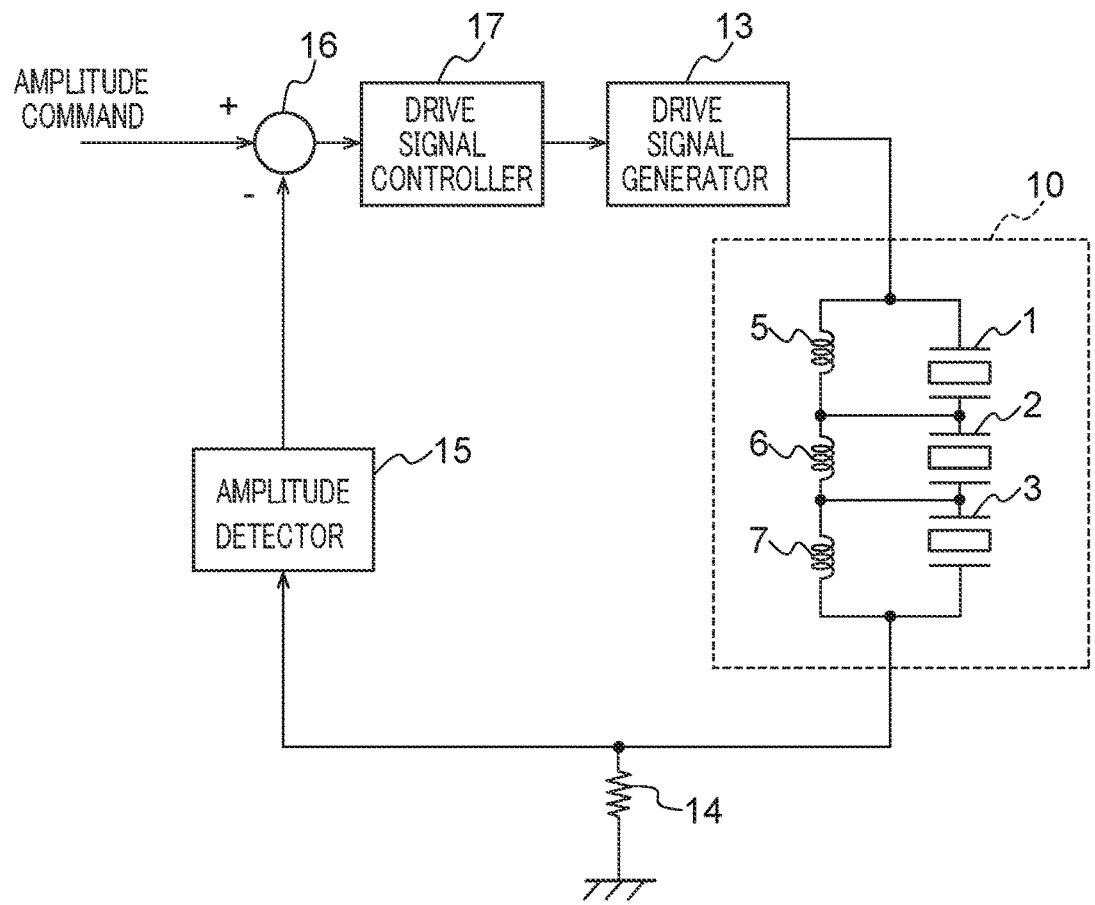
FIG. 7 is a view showing an example of a drive circuit for a vibration actuator that uses the vibrator device concerning the first embodiment.

FIG. 7 is a view showing an example of a drive circuit for the vibration actuator that uses the vibrator device 10 concerning the first embodiment. The drive circuit for the vibration actuator corresponds to the driving device for the vibration actuator. The drive circuit for the vibration actuator shown in FIG. 7 has the vibrator device 10, a drive signal generator 13, a resistance 14, an amplitude detector 15, a comparator 16, and a drive signal controller 17.

The vibrator device 10 corresponds to a part surrounded by a dotted line in FIG. 7. In the vibrator device 10, the vibrators 1, 2, and 3 are connected in series. The inductor 5 is connected in parallel to the vibrator 1, the inductor 6 is connected in parallel to the vibrator 2, and the inductor 7 is connected in parallel to the vibrator 3.

Values of the inductors 5, 6, and 7 connected in parallel to the respective vibrators are matched at a predetermined frequency near the resonance frequency of the vibrator device 10 (a frequency within a predetermined range including the resonance frequency of the vibrator device 10). That is, a relation between a matching frequency F0, the damping capacitance C0, and a value L0 of the inductor is represented by the following formula 1.

$$2\pi \cdot F_0 = \frac{1}{\sqrt{L_0 \cdot C_0}} \quad \text{[Formula 1]}$$

The drive signal generator 13 generates the alternating voltage applied to the vibrator device 10. The resistance 14 is connected to the vibrator device 10 in order to measure the electric current that flows through the vibrator device 10. The resistance 14 outputs the voltage proportional to the vibration velocity of the vibrators 1, 2, and 3. Although the vibration amplitude of the vibrator is proportional to a value obtained by integrating the vibration velocity by time in fact, the following description assumes that the vibration amplitude shall be controlled by controlling the amplitude of the vibration velocity because the amplitude of the vibration velocity is approximately proportional to the vibration amplitude.

The amplitude detector 15 detects the amplitude of the vibration velocity detected by the resistance 14. The comparator 16 compares a vibration amplitude command from a vibration amplitude command unit (not shown) with the output from the amplitude detector 15, and outputs a comparison result to the drive signal controller 17. The drive signal controller 17 controls the drive signal generator 13 on the basis of the comparison result which the comparing unit 16 outputted.

The drive signal controller 17 outputs a frequency command or an amplitude command to the drive signal generator 13. The electric current that flows through the vibrator device 10 is approximately proportional to the vibration velocity of the vibrators 1, 2, and 3 owing to the effects of the inductors 5, 6, and 7. Since the resistance 14 detects the electric current that flows through the vibrator device 10 and the drive signal controller 17 controls the alternating signal, the amplitudes of the vibrators 1, 2, and 3 are stably controlled with quick response.

Although an inductor is connected in parallel to each vibrator in the example of FIG. 7, a parallel circuit consisting of an inductor and a capacitor may be connected in parallel to each vibrator. A plurality of inductors that are connected in series or parallel may be connected in parallel to each vibrator in order to enable frequency matching at high accuracy. However, if a plurality of large-size inductors are used, the whole size of the vibrator device 10 will be enlarged. To avoid this, a capacitor may be added in parallel to the damping capacitance C0 instead of adjusting an inductor so as to adjust the value of the damping capacitance C0. This reduces enlargement of the vibrator device 10.

Next, failure of the vibrator device 10 in this embodiment will be described. Since the inductors 5, 6, and 7 are connected in series, the vibrator device 10 is able to continue to drive a contact member (for example, the cylindrical shaft 4), even if failure, such as a short circuit or disconnection, occurs in the vibrators 1, 2, and 3. Even if a part of the vibrators 1, 2, and 3 in FIG. 7 short-circuits electrically, the alternating voltage is continuously applied to the other vibrators. Since the short-circuited vibrator stops vibration, the loads to the other vibrators become heavy for that. Since the number of the available vibrators decreases, a thrust lowers if the applied voltage does not change. In the meantime, when the number of available vibrators decreases, feedback control that increases the voltage applied to the available vibrators so as to maintain the thrust starts automatically. Thereby, the drive control of the vibrator device 10 is continuable.

Next, a case where disconnection occurs in a connection with a vibrator will be described. The inductors 5, 6, and 7 are connected in parallel to the respective vibrators. Accordingly, even if connection between a piezoelectric member and wiring in a vibrator breaks under the influence of vibration, the alternating voltage is continuously applied to the other vibrators as long as connection between the inductors that are connected in series does not break. Since the broken vibrator stops vibration, the loads to the other vibrators become heavy for that. Since the number of the available vibrators decreases, the thrust lowers if the applied voltage does not change.

In the meantime, when disconnection occurs between the piezoelectric member joined to the vibrator and the wiring, a high impedance state by the parallel resonant circuit of the damping capacitance C0 and the inductor causes a state where the damping capacitance C0 disappears. This lowers the impedance and causes a state that is similar to the state where a vibrator short-circuits in greater or lesser degrees. Accordingly, since the voltage applied to the available vibrators increases, exciting force increases automatically as well as the case where a vibrator short-circuits. Thereby, the drive control of the vibrator device 10 is continuable.

When the short circuit or disconnection occurs in the vibrator device 10 as mentioned above, the electric current that flows through the vibrator device 10 increases as compared with the case where neither short circuit nor disconnection occurs. The resistance 14 is measuring the electric current that flows through the vibrator device 10. When the increase in the electric current that flows through the resistance 14 is detected, occurrence of failure such as short circuit and disconnection is detected. For example, when an amount of increase of the electric current that flows through the resistance 14 is more than a predetermined amount, the amplitude detector 15 detects that failure occurs in the vibrator device 10.

Figure 8:
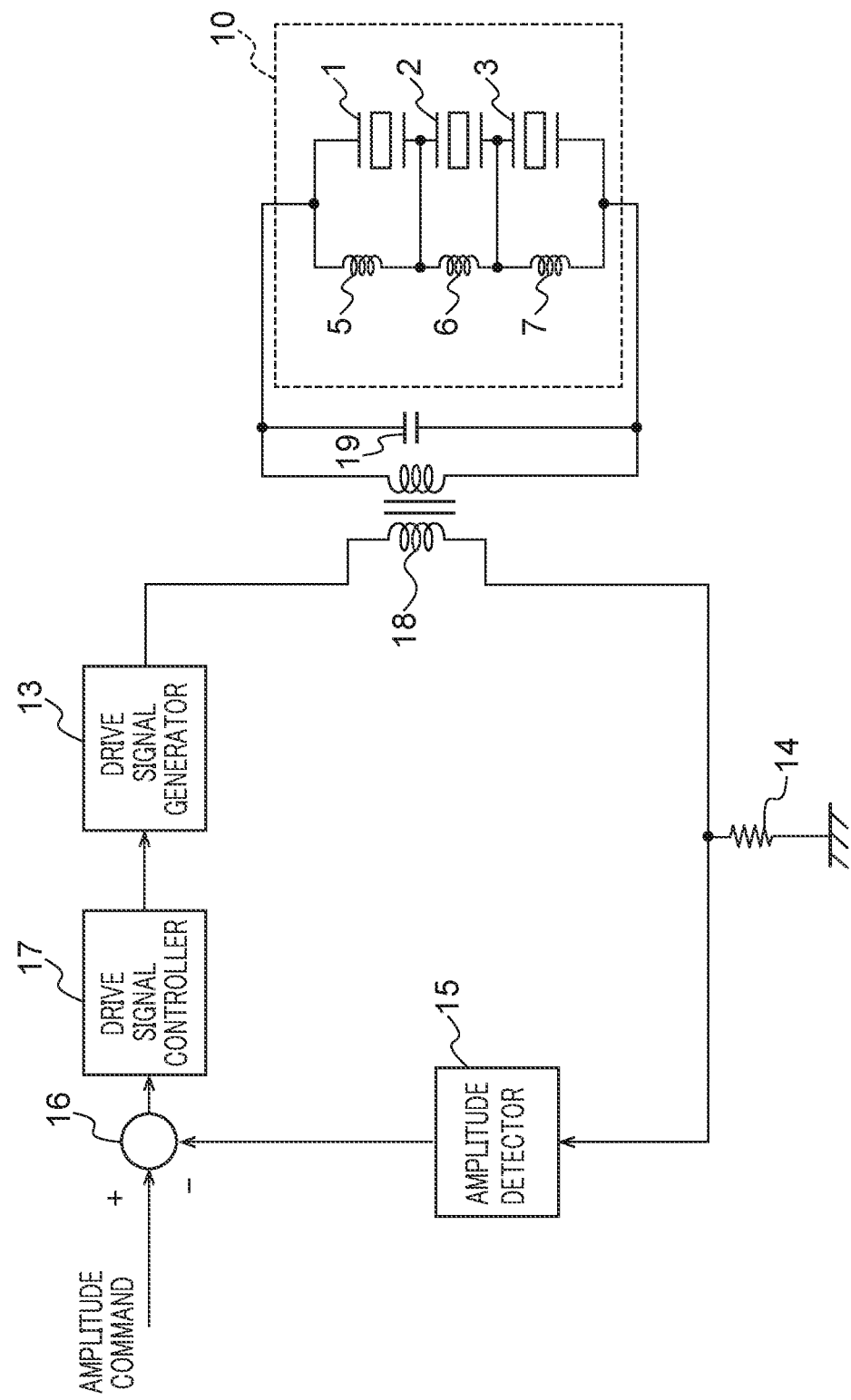
FIG. 8 is a view showing an example of a drive circuit for the vibration actuator that is configured by adding a transformer to the circuit of FIG. 7.

Next, a drive circuit for a vibration actuator to which an amplifier circuit is added will be described. FIG. 8 is a view showing an example of a drive circuit for a vibration actuator that is configured by adding a transformer 18 to the circuit of FIG. 7. The transformer 18 as an amplifier circuit is a boosting transformer and is connected to the output side of the drive signal generator 13. A capacitor 19 for frequency matching is connected in parallel to a secondary side of the transformer 18. A relation between a value Lt of inductor at the secondary side of the transformer 18, an electrostatic capacity Ct of the capacitor 19, and the matching frequency Ft that is decided by the driving frequency range of the vibrator device 10 is represented by the following formula 2.

$$2\pi \cdot F_t = \frac{1}{\sqrt{L_t \cdot C_t}} \quad \text{[Formula 2]}$$

When the frequency matching at the secondary side of the transformer 18 is appropriately taken so as to satisfy the above-mentioned formula 2, the electric current that is approximately proportional to a secondary-side current flows at a primary side of the transformer 18 within the driving frequency range mentioned above. Accordingly, the same operation as FIG. 7 is achievable by detecting the primary-side current of the transformer 18 by the resistance 14 like the drive circuit of FIG. 7.

Figure 9:
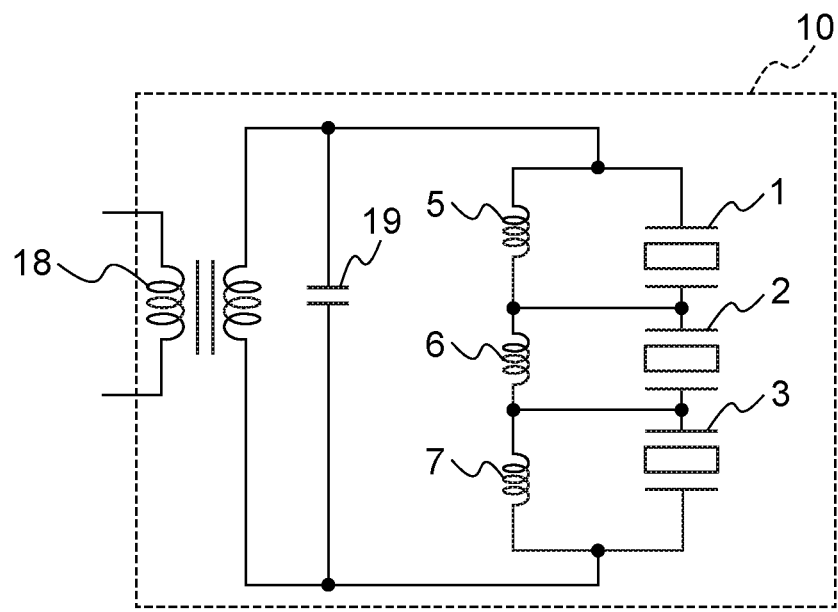
FIG. 9 is a view showing another configuration example of the vibrator device of FIG. 8.

FIG. 9 is a view showing another configuration example of the vibrator device 10 of FIG. 8. As shown in FIG. 9, the transformer 18 and the capacitor 19 are built in the vibrator device 10. Since the transformer 18 is built in the input side of the vibrator device 10, the vibrator device 10 can be driven at relatively low voltage.

Figure 10A:
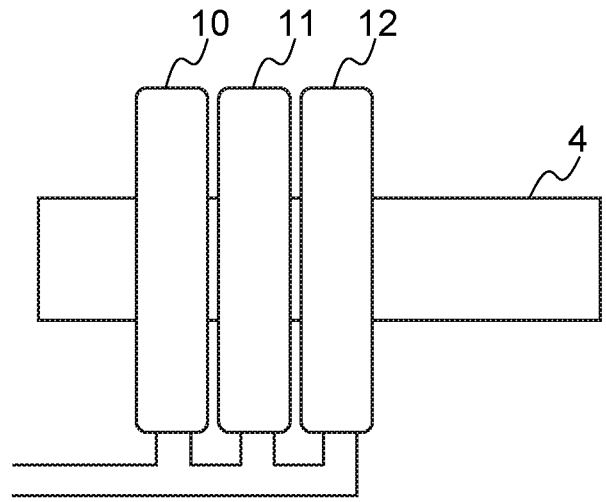
FIG. 10A and FIG. 10B are views examples of vibration actuators concerning the first embodiment.
Figure 10B:
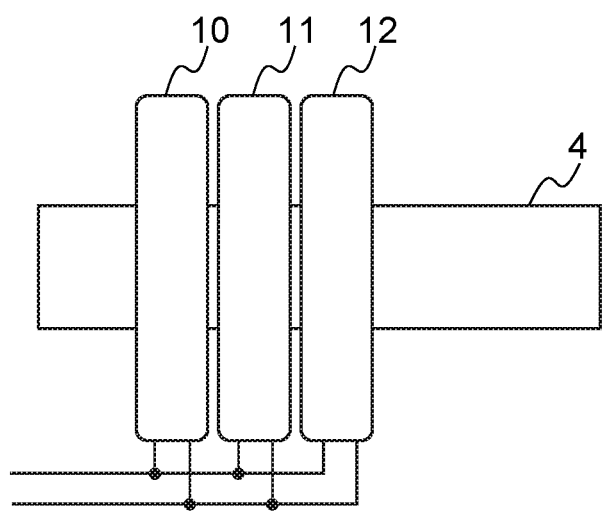

FIG. 10A and FIG. 10B are views showing examples of the vibration actuators concerning the first embodiment. FIG. 10A is a view showing an example of the vibration actuator that is constituted by connecting three vibrator devices 10, 11, and 12 in series. FIG. 10B is a view showing an example of the vibration actuator that is constituted by connecting the three vibrator devices 10, 11, and 12 in parallel.

The number of the vibrator devices 10 connected in series or in parallel is not limited to three. Since one vibrator device 10 has three vibrators as mentioned above, the vibration actuator in FIG. 10A employs nine vibrators. Nine vibrators connected in series may be built in one vibrator device. In the meantime, when the vibrators are divided into a plurality of vibrator devices, there is a merit that output torque is adjusted by adjusting the number of vibrator devices according to required output torque. The vibrator devices 11 and 12 are the same as the vibrator device 10. Three vibrators connected in series are built in each of the vibrator devices 10, 11, and 12, and the average of the resonance frequencies of three vibrators falls within the predetermined frequency range.

Hereinafter, an example of manufacturing of the vibrator devices 10, 11, and 12 shown in FIG. 10A and FIG. 10B will be described. The vibrator devices 10, 11, and 12 may be manufactured manually or automatically. For example, when the fixed number (tens through hundreds, for example) of vibrators are manufactured, a list of resonance frequencies is created on the basis of measuring results of the resonance frequencies of the respective vibrators. Next, on the basis of the list of resonance frequency, the fixed number of vibrators are classified into some classes corresponding to the frequency ranges by referring to the resonance frequency list. For example, the fixed number of vibrators are classified every 500 Hz. Then, three vibrators are selected at random from the same class and the average of the resonance frequencies of the three vibrators is calculated. Random selection of three vibrators is repeated until obtaining a combination of three vibrators of which the average of resonance frequencies falls within a frequency range (for example, a predetermined frequency±25 Hz) that is beforehand decided for every class. When three vibrators of which the average of resonance frequencies falls within the frequency range that is beforehand decided for every class are obtained, one vibrator device is constituted by these three vibrators.

Accordingly, three vibrators of which the average of the resonance frequencies falls within the above-mentioned frequency range are built in one vibrator device. It is difficult to prepare many vibrators of which resonance frequencies are close. In the meantime, the method for preparing vibrators using the average of the resonance frequencies like this embodiment enables to prepare relatively large number of vibrators.

Moreover, vibrators that constitute one vibrator device may be selected using dispersion of resonance frequencies instead of the average. That is, in this case, vibrators of which the dispersion of the resonance frequencies falls within a predetermined dispersion range are built in one vibrator device. When the dispersion is set to a large value to some extent, there is unevenness of the resonance frequencies of the selected vibrators, which stabilizes the characteristic of the vibrator device. As mentioned above, when a vibration actuator is constituted by combining a plurality of vibrator devices of the same class, a high-power and high-efficiency vibration actuator is manufactured stably.

In the case in FIG. 10A, the three vibrator devices 10, 11, and 12 are connected in series. When the number of the vibrator devices connected in series increases, it is necessary to enlarge the amplitude of the alternating voltage, which increases the applied voltage. When the applied voltage becomes high, the entire vibrator device is enlarged for applying an insulation countermeasure, etc. This increases a cost.

Accordingly, the configuration in which the vibrator devices 10, 11, and 12 are connected in parallel can be employed as shown in FIG. 10B. In this case, since the three vibrator devices 10, 11, and 12 are connected in parallel, the vibrator devices are driven by the alternating voltage of the amplitude that is one third of the amplitude of the case where the three vibrator devices 10, 11, and 12 are connected in series.

The vibrator devices 10, 11, and 12 belong in the same class as mentioned above, the resonance frequencies (averages of the resonance frequencies of the built-in vibrators) of the vibrator devices are approximately equal. Moreover, since the three vibrators are equally arranged around the cylindrical shaft 4, the loads of three vibrators are equalized. Accordingly, there is little load fluctuation during rotation. This reduces the difference between the vibration velocities of the vibrator devices and achieves efficient drive.

Figure 11A:
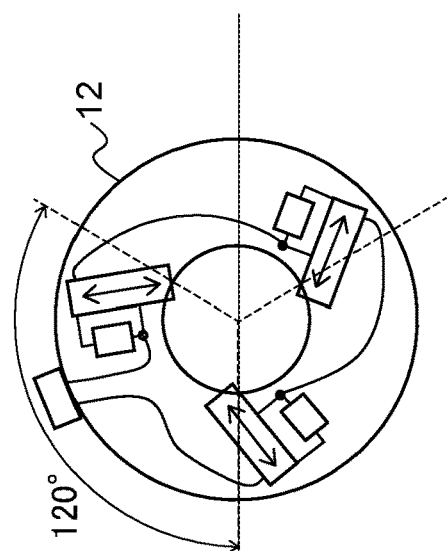
FIG. 11A, FIG. 11B, and FIG. 11C are views showing attachment phases of the respective vibrator devices to the cylindrical shaft.
Figure 11B:
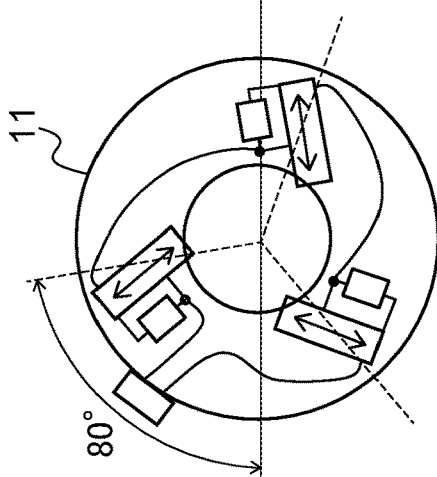
Figure 11C:
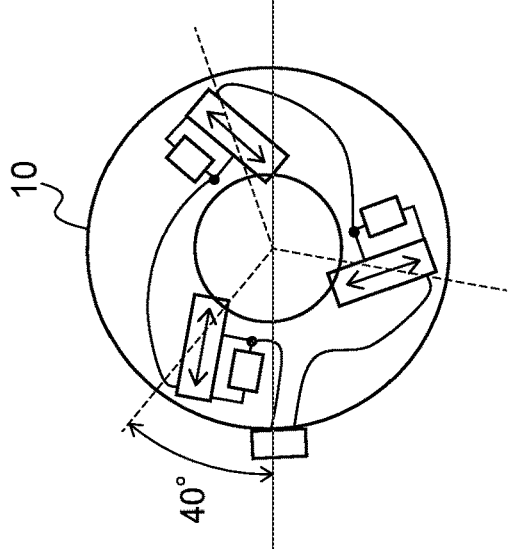

FIG. 11A, FIG. 11B, and FIG. 11C are views showing attachment phases of the respective vibrator devices 10, 11, and 12 to the cylindrical shaft 4. The three vibrator devices are attached so that the rotation phases are shifted every 40 degrees. Since the vibrator devices 10, 11, and 12 are equally arranged around the cylindrical shaft 4 by shifting the phases by the predetermined angle as shown in FIG. 11A, FIG. 11B, and FIG. 11C, rotation of the cylindrical shaft 4 with few torque fluctuation is achieved. The three vibrators are connected in series in each of the vibrator devices 10, 11, and 12 in the example shown in FIG. 11A, FIG. 11B, and FIG. 11C, the vibrators are arranged every 120 degrees. When the vibrator device has two vibrators, two vibrators are preferably arranged every 180 degrees. Moreover, when the vibrator device has four vibrators, four vibrators are preferably arranged every 90 degrees.

Figure 12:
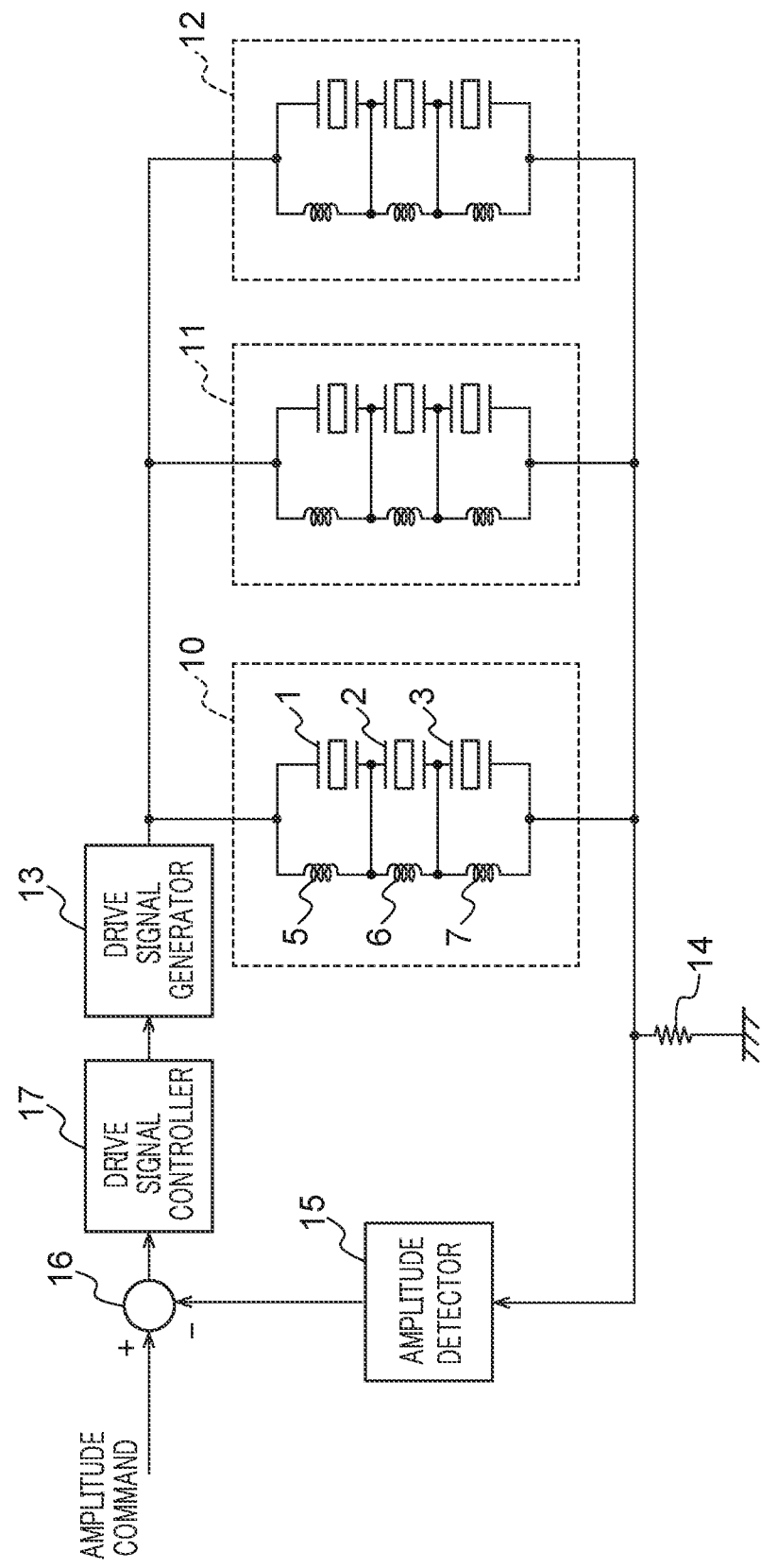
FIG. 12 is a view showing a drive circuit for the three vibration actuators of FIG. 10B.

FIG. 12 is a view showing a drive circuit for the three vibration actuators of FIG. 10B. Each of the vibrator devices 10, 11, and 12 has three vibrators connected in series and inductors connected in parallel to the three vibrators. The value of the inductor connected in parallel to each vibrator is matched at a predetermined frequency within the frequency range of the alternating voltage that the drive signal generator 13 outputs. That is, a relation between the matching frequency F0, the damping capacitance C0, and the value L0 of the inductor is represented by the above-mentioned formula 1.

The drive signal generator 13 generates the alternating voltage applied to the vibrator devices 10, 11, and 12. The resistance 14 is used to measure the total electric current that flows through the vibrator devices 10, 11, and 12. Since the resonance frequencies of the vibrator devices 10, 11, and 12 are made uniform, an almost equivalent average load is applied to each of the vibrators that are equally arranged around the cylindrical shaft 4. Accordingly, the phase of inflow electric current does not deviate largely.

Accordingly, the amplitude detector 15 outputs the voltage proportional to the sum of the amplitudes of electric currents that flow through the vibrator devices 10, 11, and 12. Then, the comparator 16 compares the sum of the amplitudes of electric currents with the vibration amplitude command from the command unit (not shown). The drive signal controller 17 controls the frequency or amplitude of the alternating voltage that the drive signal generator 13 outputs on the basis of the comparison result.

Although the example that the plurality of vibrator devices drives the same contact member is described in this embodiment, the plurality of vibrator devices may respectively drive different contact members. In this case, although it is difficult to drive the contact members at the completely same speed, the circuit structure can be reduced because the plurality of contact members are simultaneously driven at the similar vibration velocities.

Moreover, although the example in which the vibrators of the same configuration are applied to each vibrator device is described in this embodiment, the vibrators of different configurations may be applied to each vibrator device as long as the resonance frequencies of the vibrators fall within the predetermined range.

Moreover, FIG. 10A and FIG. 10B respectively show the vibration actuators in which the plurality of vibrator devices 10, 11, and 12 are connected in series and in parallel. Conditions of the contact member may differ according to the positions that the vibrator devices 10, 11, and 12 contact. For example, the diameter of the cylindrical shaft 4 may differ according to the positions that the vibrator devices 10, 11, and 12 contact. In such a case, it is preferable to set different vibration velocities for the respective vibrator devices 10, 11, and 12 in order to drive the contact member properly. For this reason, the configuration in which the transformer 18 is provided inside each of the vibrator devices 10, 11, and 12 as shown in FIG. 9 is employed. Then, the ratio of the vibration velocities is adjusted by adjusting the winding ratios of the transformers 18. That is, the vibration velocity of each of the vibrator devices 10, 11, and 12 is properly controlled by changing the winding ratio of each of the transformers 18 according to the condition of the contact member.

Figure 13:
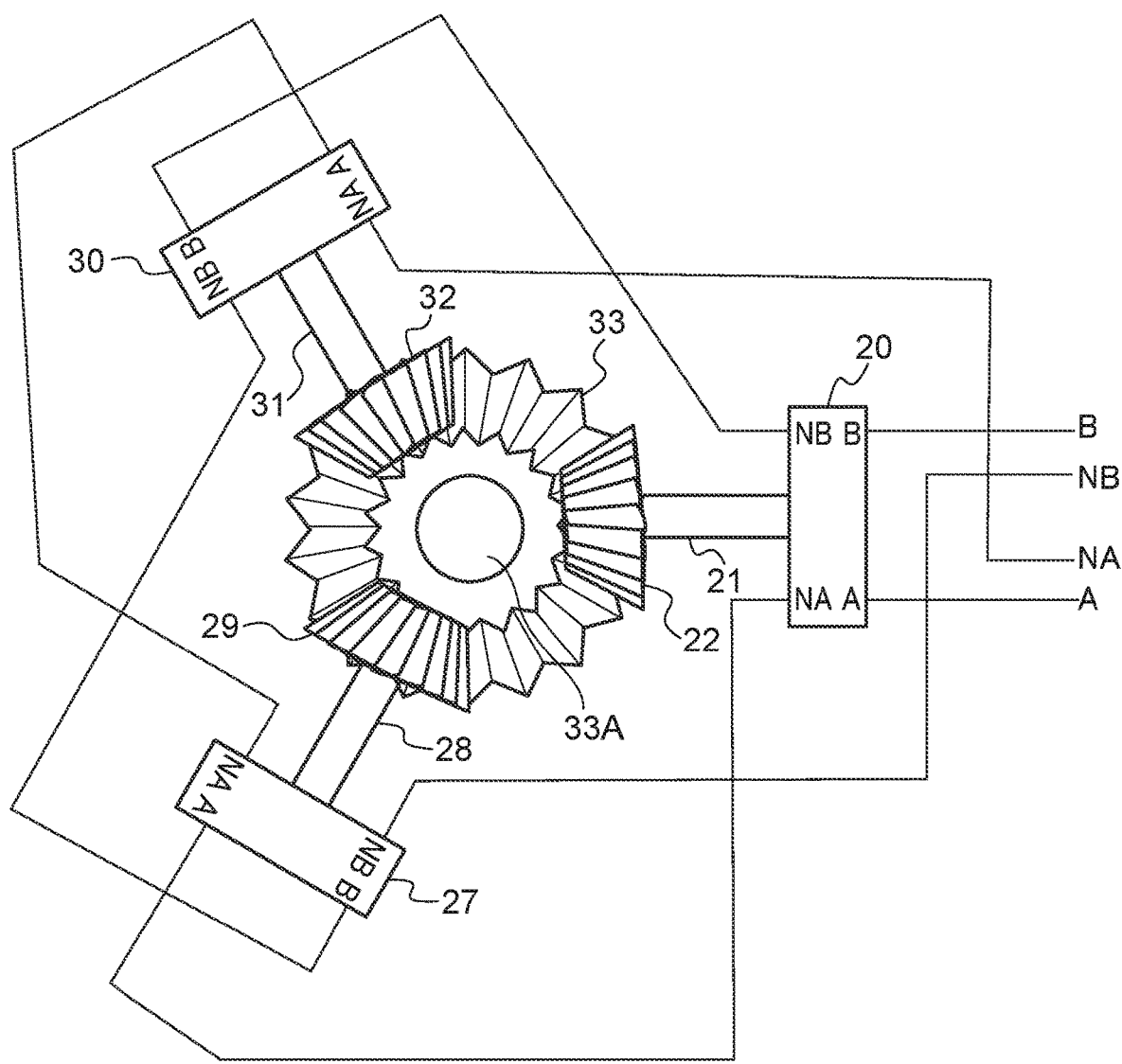
FIG. 13 is a view showing an example of a vibration actuator concerning a second embodiment.

Next, a second embodiment of the present invention will be described. FIG. 13 is a view showing an example of a vibration actuator concerning the second embodiment. As shown in FIG. 13, each of three shaft-output vibration actuators 20, 27, and 30 has one vibrator and joins to a rotation shaft 33A using a bevel gear mechanism to rotate the rotation shaft 33A. A bevel gear 22 is attached at a front end of an output shaft 21 of the vibration actuator 20. A bevel gear 29 is attached at a front end of an output shaft 28 of the vibration actuator 27. A bevel gear 32 is attached at a front end of an output shaft 31 of the vibration actuator 30. The bevel gears 22, 29, and 32 engage with a larger bevel gear 33 attached to the rotation shaft 33A at angular intervals of 120 degrees.

Figure 14:
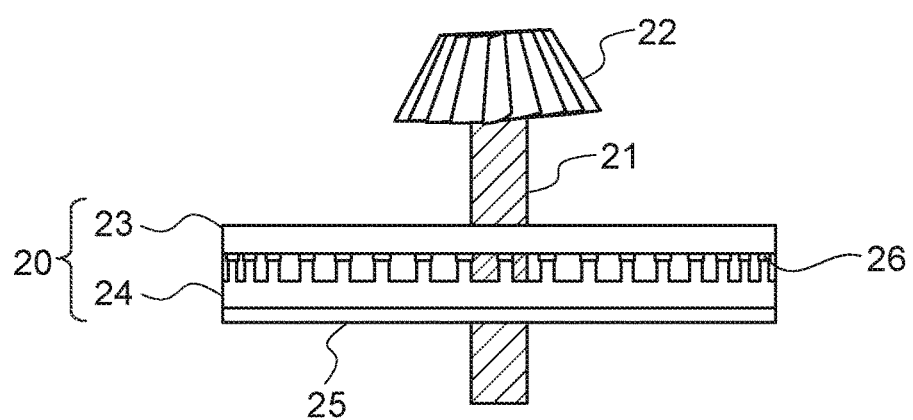
FIG. 14 is a view showing a configuration of the vibration actuator concerning the second embodiment.

The vibrators of the respective vibration actuators 20, 27, and 30 are electrically connected in series. Alternating voltages of which phases are shifted by 90 degrees are applied to drive voltage lines of phases A, NA, B, and NB. Thereby, vibrations are excited and the bevel gear 33 connected indirectly is driven. FIG. 14 is a view showing one example of a configuration of the vibration actuator 20 concerning the second embodiment. The vibration actuator 20 has a rotor 23, ceramic elastic body 24, piezoelectric member 25, and friction member 26. The output shaft 21 is joined to the center of the rotor 23. The output shaft 21 and rotor 23 are supported rotatably. The ceramic elastic body 24 is a non-conductive member that has a comb-like projection structure. The piezoelectric member 25 is adhered to the ceramic elastic body 24. Moreover, the friction member 26 is adhered on the projection structure of the ceramic elastic body 24. The material of the friction member 26 is selected so that a contact portion to the rotor 23 slowly and stably wears out.

Figure 15:
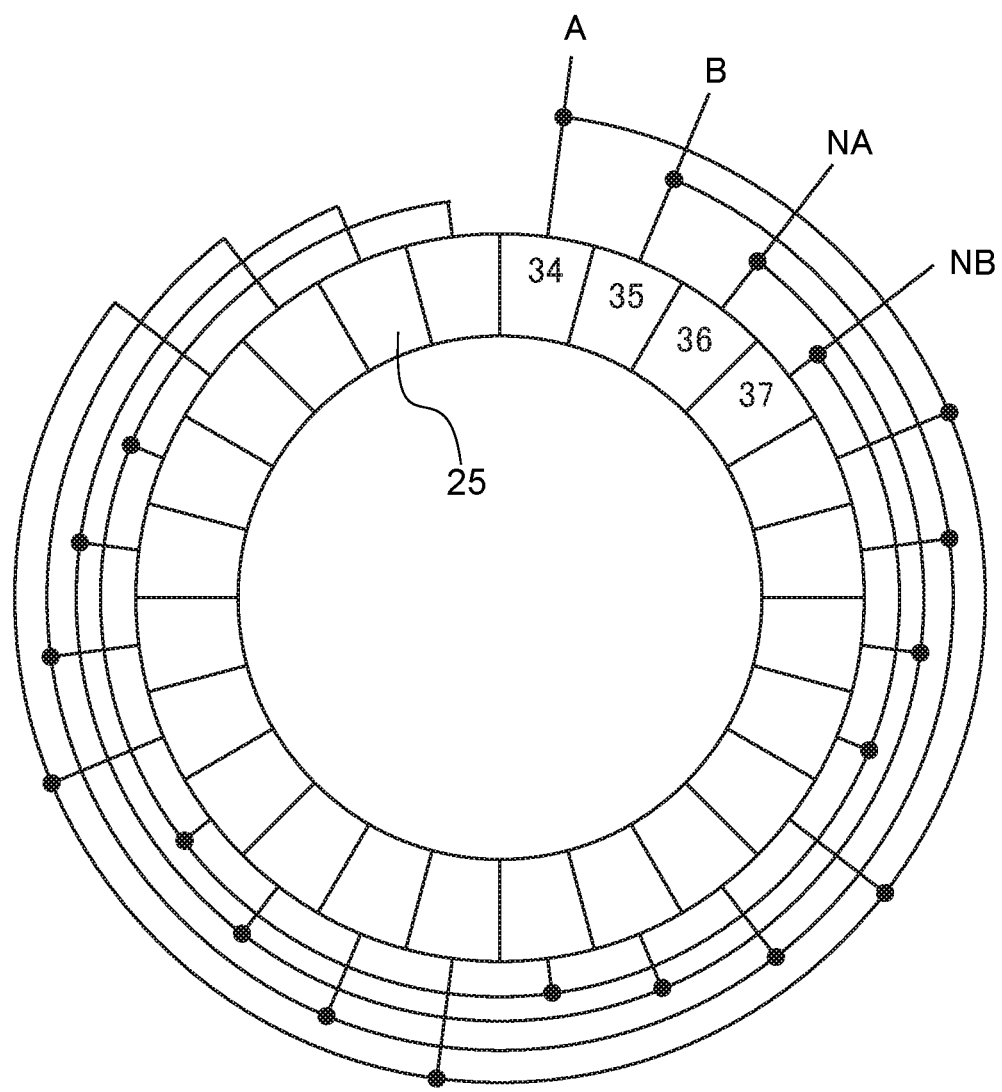
FIG. 15 is a view showing an electrode structure of a circular piezoelectric member.

FIG. 15 is a view showing an electrode structure of the circular piezoelectric member 25. FIG. 15 shows a connection state between electrodes 34, 35, 36, and 37 of the piezoelectric member 25 on its front surface and the drive voltage lines of the phases A, B, NA, and NB.

Figure 16:
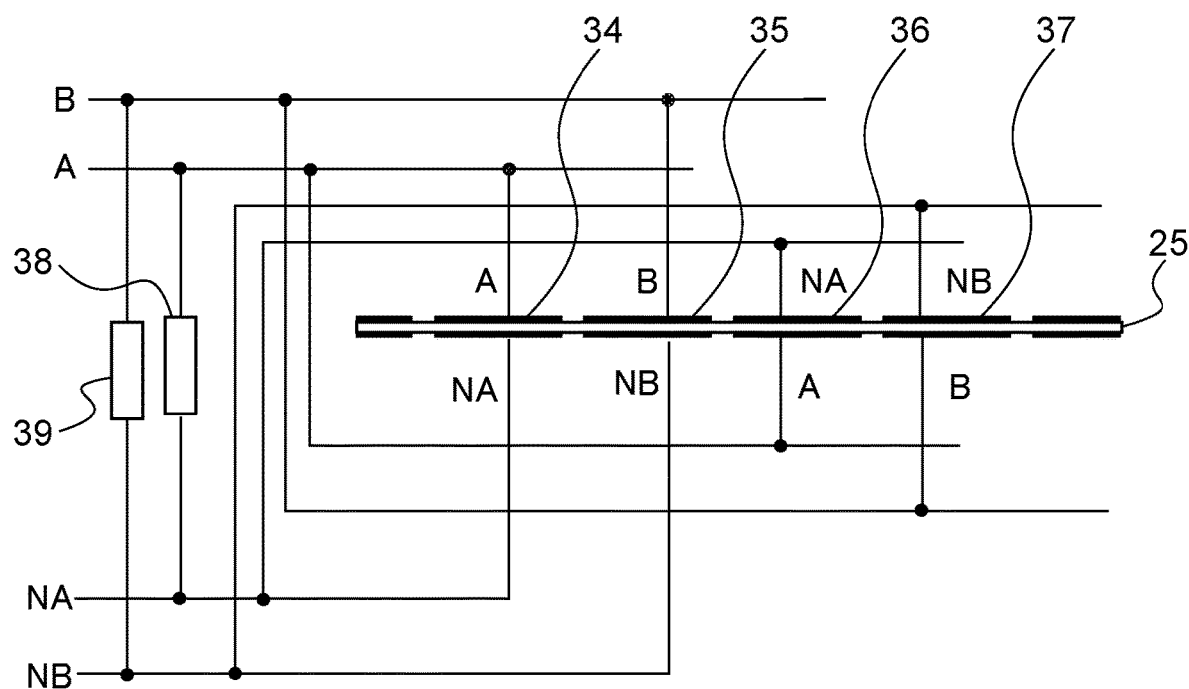
FIG. 16 is a view showing a wiring structure of the piezoelectric member.

FIG. 16 is a view showing a wiring structure of the piezoelectric member 25. Electrodes of the piezoelectric member 25 on its back surface are also distributed as well as the electrodes 34, 35, 36, and 37 shown in FIG. 15. A back electrode of the phase NA is opposite to the electrode 34 of the phase A. A back electrode of the phase BA is opposite to the electrode 35 of the phase B. As shown in FIG. 16, an inductor 38 is connected in parallel between the phases A and NA and an inductor 39 is connected in parallel between the phases B and NB. The phase difference between the alternating voltages applied to the phases A and NA is equal to 180 degrees, and the phase difference between the alternating voltages applied to the phases B and NB is the same as it.

Figure 17:
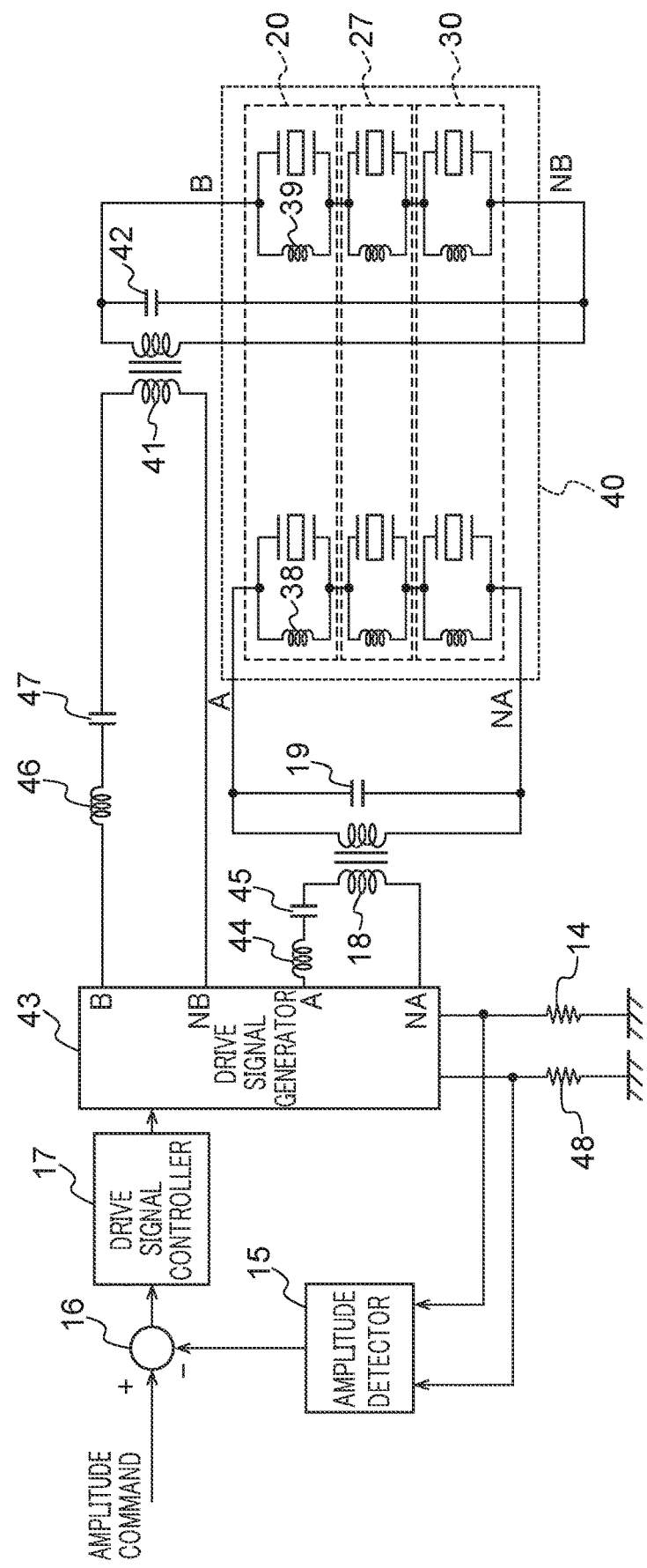
FIG. 17 is a view showing a first example of a drive circuit for the vibration actuator concerning the second embodiment.

FIG. 17 is a view showing a first example of a drive circuit for the vibration actuator concerning the second embodiment. In the vibration actuator 20, a plurality of vibration sections of which phases are different are formed by the alternating voltages that have the phase difference of 180 degrees and are input by the phases A and NA and the phases B and NB. The two vibration sections of which phases are different are indicated by two vibrators in FIG. 17. The inductor 38 is connected in parallel between the phases A and NA and the inductor 39 is connected in parallel between the phases B and NB.

The vibration actuators 27 and 30 are connected similarly, and the vibration actuators 20, 27, and 30 are connected in series for each phase. In the example in FIG. 17, the three vibration actuators 20, 27, and 30 are connected in series and constitute one vibration actuator 40 that has terminals A, NA, B, and NB as a whole. An area surrounded with a broken line indicates each vibration actuator 20, 27, and 30. An area surrounded by a dotted line indicates the vibration actuator 40.

The capacitor 19 for frequency matching and the secondary side winding of the transformer 18 for amplification are connected in parallel between the terminals A and NA of the vibration actuator 40. Moreover, the capacitor 42 for frequency matching and the secondary side winding of the transformer 41 for amplification are connected in parallel between the terminals B and NB of the vibration actuator 40. The drive signal generator 43 generates an alternating voltage. H-bridge circuits (power amplification circuits, not shown) are respectively connected between the terminals A and NA and between the terminals B and NB of the drive signal generator 43.

Waveforms of pulse drive signals that the H-bridge circuits output are shaped by series resonant circuits constituted by inductors 44 and 46 and capacitors 45 and 47 that are inserted between the transformers 18 and 41 and the drive signal generator 43. Then, the pulse drive signals after the waveform shaping are amplified by the transformers 18 and 41, and are applied to the vibration actuator 40. The series resonant circuits constituted by the inductors 44 and 46 and the capacitors 45 and 47 are subjected to matching adjustment at a predetermined frequency within a driving frequency range of the vibration actuator 40. This suppresses large fluctuation of the drive voltage amplitude of the vibration actuator 40 within the driving frequency range.

Resistances 14 and 48 for current measurement are respectively connected to source terminals for electric current detection of the H-bridge circuits of the drive signal generator 43. The resistances 14 and 48 are measuring the electric currents corresponding to the vibration velocities of the vibrators included in the vibration actuator 40. The amplitude detector 15 detects the amplitude of the vibration velocities of the vibrators on the basis of the measurement values of the resistances 14 and 48. The comparator 16 compares the vibration amplitude command from the vibration amplitude command unit (not shown) with the detection results (amplitude velocities of the vibrators) of the amplitude detector 15. The drive signal controller 17 outputs at least one command among commands about the frequency, pulse width, and voltage amplitude to the drive signal generator 43 according to the comparison result.

Generally, a vibration actuator has irregularity or fluctuation in a resonance frequency or an internal loss under the influence of manufacture irregularity of a friction member or pressure irregularity owing to plane accuracy of a vibrator. In addition, since there are variation depending on a rotation angle and variation with time resulting from progress of wear, it is difficult to make vibration characteristics of a plurality of vibration actuators uniform. As a countermeasure for this, an inductor is connected in parallel to each of the vibrators that are connected in series in this embodiment as mentioned above. This makes the amplitude characteristics of the vibrators uniform, allows to transmit the comparatively equal force to the bevel gear 33, and enables the efficient drive with little wear of the gears.

Although the vibration actuator 40 does not include the transformers 18 and 41, the inductors 44 and 46, and the capacitors 45 and 47 in the example in FIG. 17, some or all of these components may be included in the vibration actuator 40. Since the vibration actuator 40 includes the components that are subjected to the frequency matching in accordance with the inherent resonance frequency, adjustment at the time of using the vibration actuator 40 becomes unnecessary. This reduces variation in performance and improves convenience of the user who uses the vibration actuator 40. Moreover, either of the inductor 44 and the capacitor 45 may be connected in series to the primary side of the transformer 18. Similarly, either of the inductor 46 and the capacitor 47 may be connected in series to the primary side of the transformer 41. A capacitor is used to intercept direct current and an inductor has an effect to smooth a waveform.

Moreover, in this embodiment, the entire configuration including the three vibration actuators 30, 27, and 30 that are connected in series and are united by the bevel gear 33 is described as the one vibration actuator 40. Assuming that the vibration actuator 40 is one vibrator device, a configuration in which the vibrator devices are connected in series or in parallel can be also employed. Thereby, a high-output vibration actuator is constituted. In this case, it is preferable that the average of the resonance frequencies of the vibrators in each of the vibration actuators, which constitute the vibrator devices, be approximately equal to the average of the resonance frequencies of the three vibrators in the vibration actuator 40.

Moreover, the above-mentioned vibrator devices may be mechanically combined by connecting a plurality of complex vibration actuators as shown in FIG. 13 in a state where a plurality of gears equivalent to the bevel gear 33 are fixed to the same shaft 33A. Alternatively, the vibrator devices may be combined through other gears.

Figure 18:
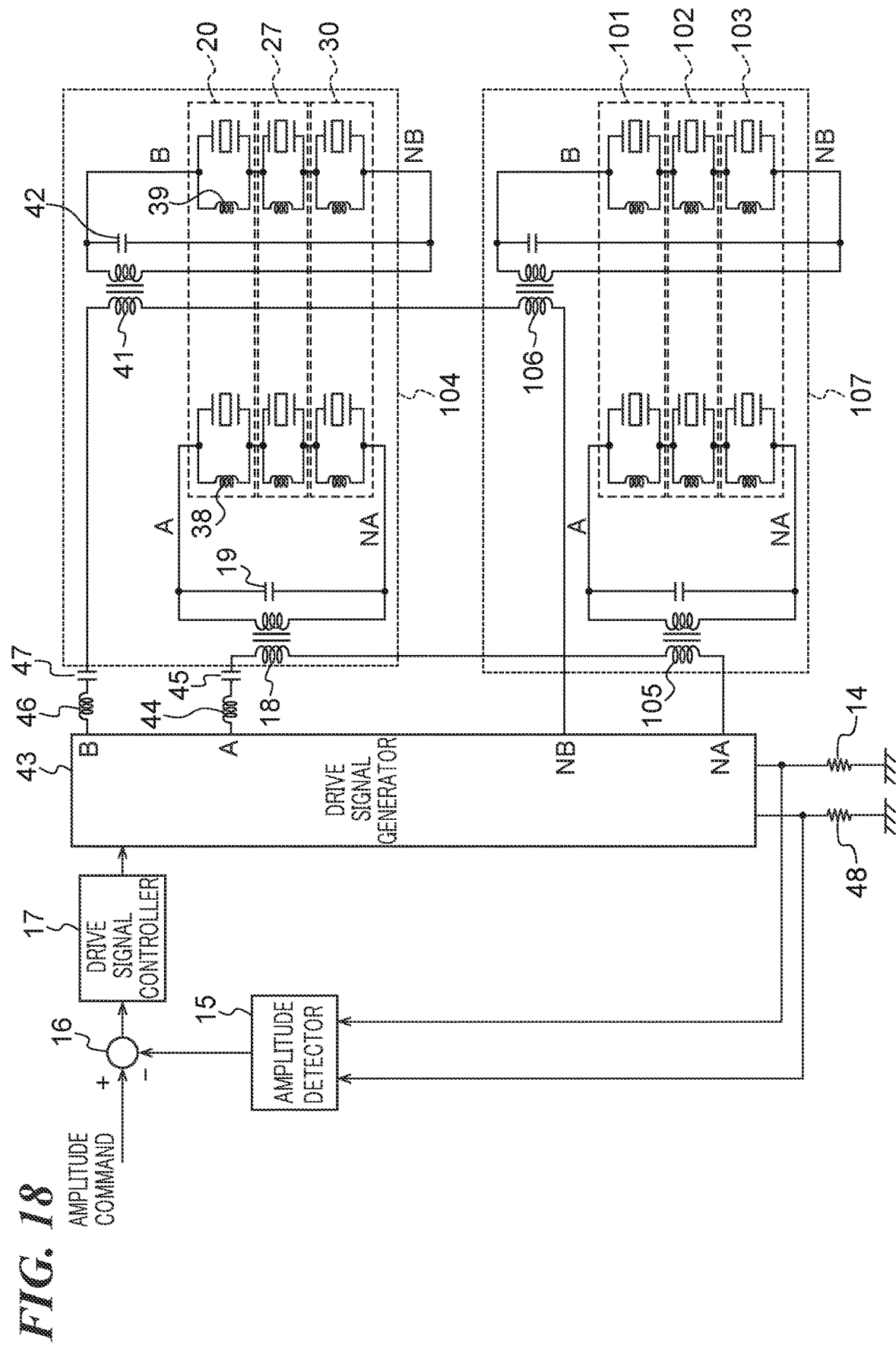
FIG. 18 is a view showing a second example of a drive circuit for the vibration actuator concerning the second embodiment.

FIG. 18 is a view showing a second example of a drive circuit for the vibration actuator concerning the second embodiment. In the drive circuit for the vibration actuator of the second example, two vibrator devices 104 and 107 are connected in series. The vibrator device 104 has the vibration actuators 20, 27, and 30 and the transformers 18 and 41. The vibrator device 107 has vibration actuators 101, 102, and 103 and transformers 105 and 106. In the drive circuit for the vibration actuator in FIG. 18, the ratio of the rotational speeds of the vibrator devices is adjustable by changing the winding ratios of the transformers of the vibrator devices.

Moreover, the three vibration actuators 20, 27, and 30 connected in series in the vibrator device drive one shaft through the bevel gears 22, 29, and 32 in the second embodiment. In the meantime, the vibration actuators may drive different contact members, respectively. For example, when a plurality of dolls, which are contact members that are not necessary to move synchronously, decorated in a show window are driven, a plurality of vibration actuators are applicable to drive the dolls. This case is effective because the plurality of vibration actuators are stably driven at an appropriate speed.

For example, a doll is attached in place of the bevel gear 22 of the vibration actuator in FIG. 14. When three vibration actuators to which different dolls are respectively attached are electrically connected in series, the three dolls are rotated at the almost same speed. Moreover, the drive circuit for the vibration actuator in FIG. 18 is able to change the rotation speeds of the dolls for every vibrator device by adjusting the winding ratio of each transformer. Moreover, when the gear ratio of the engaged gears is adjusted while adjusting the winding ratio of each transformer, the adjustment depending on required torque is also available.

Figure 19A:
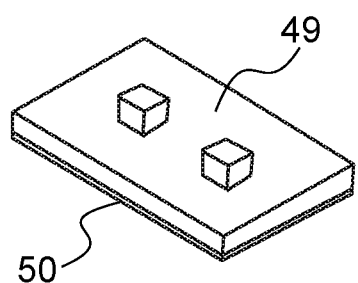
FIG. 19A through FIG. 19D are views showing a configuration and vibration modes of a vibrator concerning a third embodiment.
Figure 19B:
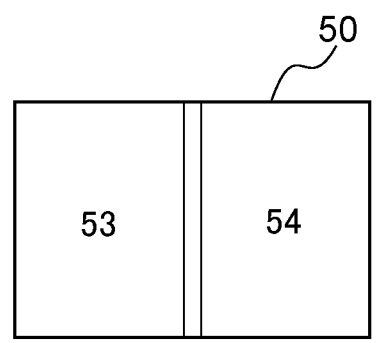

Next, a third embodiment will be described. FIG. 19A through FIG. 19D are views showing a configuration and vibration modes of a vibrator concerning the third embodiment. As shown in FIG. 19A, a vibrator 49 has a plate shape and is manufactured from non-conductive material. Two projections that contact a contact member are provided in the surface of the vibrator 49. A piezoelectric member 50 constitutes a part of the vibrator 49 and vibrates the vibrator 49. FIG. 19B shows electrodes 53 and 54 provided in the piezoelectric member 50. The electrodes 53 and 54 are electrically insulated. Two alternating voltages of which phases vary independently are respectively applied to the electrode 53 and the electrode 54. Two similar electrodes are also provided on a back surface of the piezoelectric member 50 and are configured so as to enable energization from the front surface through via holes (not shown) provided in parts of the electrodes 53 and 54.

Figure 19C:
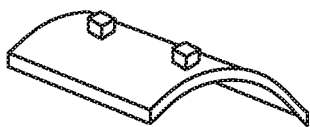
Figure 19D:
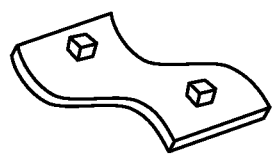

FIG. 19C shows a vibration form in a vibration mode excited when alternating voltages of the same phase are applied to the electrodes 53 and 54. FIG. 19D shows a vibration form of the vibration mode excited when alternating voltages of opposite phases are applied to the electrodes 53 and 54. When the phase difference between the alternating voltages applied to the electrodes 53 and the electrode 54 is 0 degrees, the vibration mode of FIG. 19C is excited. When the phase difference between the alternating voltages applied to the electrodes 53 and the electrode 54 is 180 degrees, the vibration mode of FIG. 19D is excited.

Moreover, when the phase difference of alternating voltages is an angle between 0 degrees and 180 degrees, both the vibration modes are excited simultaneously. The phase difference of alternating voltages is an angle between 0 degrees and 120 degrees in many cases. Then, a contact member that presses the projections provided in the vibrator 49 moves. When the contact member is a rectangular parallelepiped, the contact member that presses the projections provided in the vibrator 49 moves in a rectangular longitudinal direction.

Figure 20A:
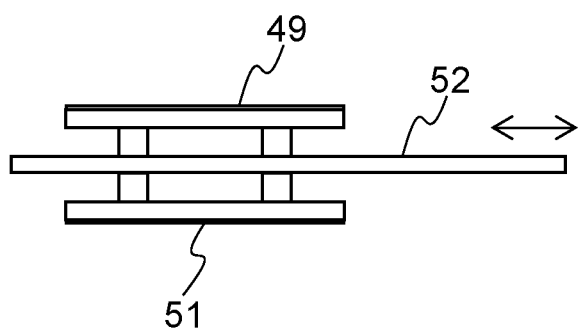
FIG. 20A and FIG. 20B are views showing a first example of a linear-motion vibration actuator of the third embodiment.
Figure 20B:
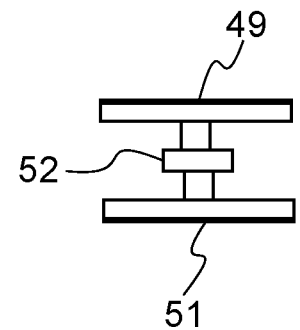

FIG. 20A and FIG. 20B are views showing a first example of a linear-motion vibration actuator of the third embodiment. FIG. 20A is a figure viewed from a direction that intersects perpendicularly with a moving direction of a contact member 52. Projections of the two vibrators 49 and 51 are arranged face to face mutually and are configured so that the contact member 52 will move in a direction of an arrow in FIG. 20A in a state where the projections put the contact member 52 therebetween from the vertical direction. FIG. 20B is a figure viewed from the moving direction of the contact member 52. The vibrators 49 and 51 are arranged symmetrically in the vertical direction (are arranged equally at angular intervals of 180 degrees on the circumference) with respect to the contact member 52.

Figure 21:
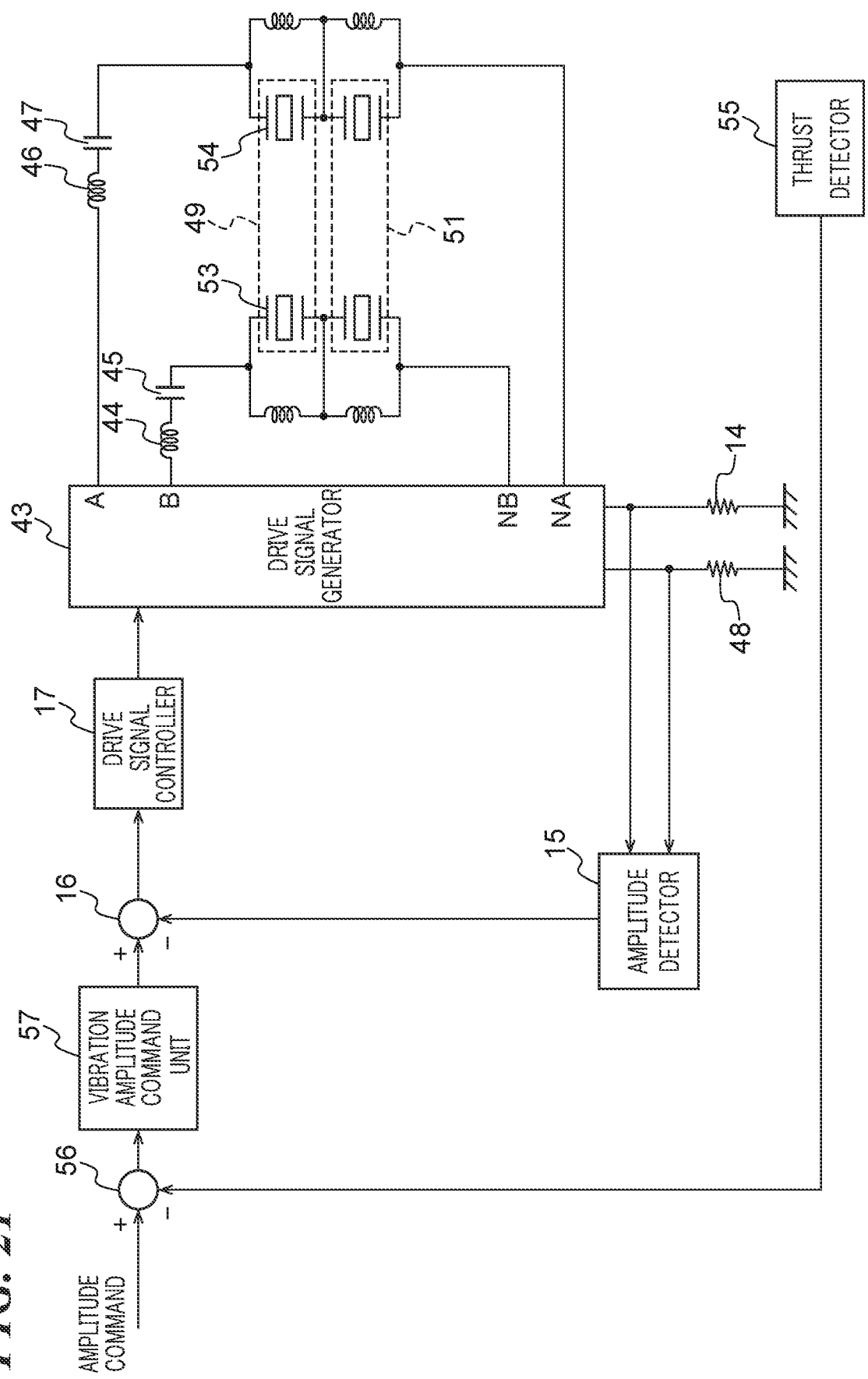
FIG. 21 is a view showing a first example of a drive circuit for the vibration actuator concerning the third embodiment.

FIG. 21 is a view showing a first example of the drive circuit for the vibration actuator concerning the third embodiment. As shown in FIG. 21, the piezoelectric members of the vibrator 49 and the piezoelectric members of the vibrator 51 are connected in series for each phase, and the inductors are respectively connected in parallel to the vibrators 49 and 51. The vibrators 49 and 51 are connected to the H-bridge of the drive signal generator 43 through the series resonant circuit that consists of the inductors 44 and 46 and the capacitors 45 and 47.

The series resonant circuit may consist of inductors only or capacitors only. The drive signal generator 43 outputs pulse signals of four phases that differ every 90 degrees. A thrust detector 55 detects thrust to the contact member 52 and outputs the detected thrust to a comparator 56. The comparator 56 compares the detected thrust with a thrust command from an command unit (not shown) and outputs a comparison result. A vibration amplitude command unit 57 controls the vibration amplitudes of the vibrators 49 and 51 according to the comparison result that the comparator 56 outputs.

Moreover, the resistance 14 and 48 for measuring the electric currents corresponding to the vibration velocities of the vibrators 49 and 51 are connected to the source terminals for electric current detection of the H-bridges of the drive signal generator 43. The amplitude detector 15 detects the vibration amplitudes from the electric currents that the resistances 14 and 48 measure. The comparator 16 compares the detected vibration amplitudes and the vibration amplitude command from the vibration amplitude command unit 57. The drive signal controller 17 controls at least one of the frequency, pulse width, and voltage amplitude of the pulse signals that the drive signal generator 43 generates according to the comparison result.

For example, when the thrust of the vibrators 49 and 51 is smaller than a target value, the frequency of the alternating voltage that the drive signal generator 43 outputs approaches the resonance frequency of the vibrators 49 and 51, and the vibration amplitudes of the vibrators 49 and 51 increase. Thereby, the thrust of the vibrators 49 and 51 increases. The moving speed of the contact member 52 can be controlled when a configuration in which the thrust detection part 55 is replaced with a speed detector that detects the speed of the contact member 52 and the comparator 56 compares the detected speed with a speed command from a command unit (not shown) is employed.

Figure 22A:
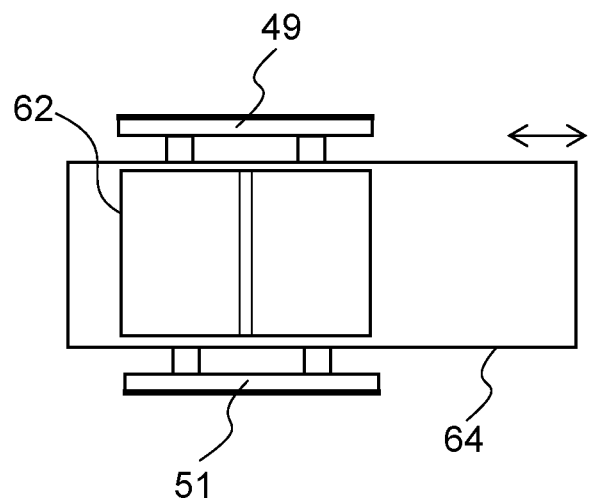
FIG. 22A and FIG. 22B are views showing a second example of a linear-motion vibration actuator concerning the third embodiment.
Figure 22B:
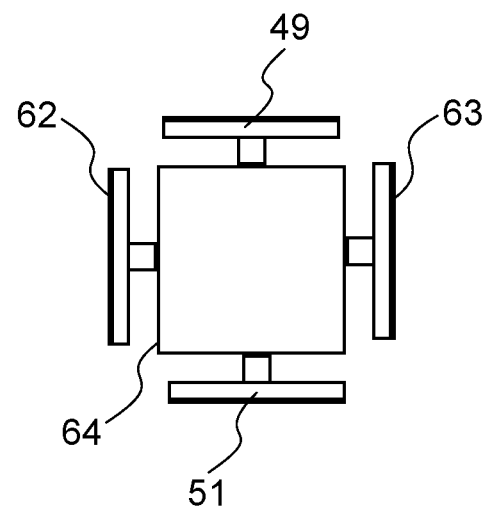

Moreover, although the vibrator device is constituted by the upper and lower two vibrators 49 and 51 that put the contact member 52 therebetween in the example of FIG. 20A and FIG. 20B, the contact member 52 may be a prism having a square section and the vibrators 49 and 51 may be configured so that the four projections respectively press the four sides of the prism. FIG. 22A and FIG. 22B are views showing a second example of a linear-motion vibration actuator concerning the third embodiment. As shown in FIG. 22A and FIG. 22B, four vibrators 49, 51, 62, and 63 are equally arranged around a contact member 64 that is a prism having a square section at angular intervals of 90 degrees on the circumference. The vibrators 49, 51, 62, and 63 shown in FIG. 22A and FIG. 22B are connected in series for each phase of the alternating voltage that is applied to two electrodes (not shown) of a piezoelectric member of each vibrator. And the inductors are respectively connected in parallel to the vibrators. The contact member 64 may be a cylindrical shape having a circular section.

Although one vibrator device is constituted by connecting the four vibrators in series in the example of FIG. 22A and FIG. 22B, a configuration in which two vibrator devices each of which is constituted by two vibrators that are opposite to each other are connected in series or in parallel may be employed. Moreover, a configuration in which a plurality of vibrator devices each of which is constituted by four vibrators are arranged along the moving direction of the contact member 64 and are connected in parallel or in series may be employed.

Figure 23:
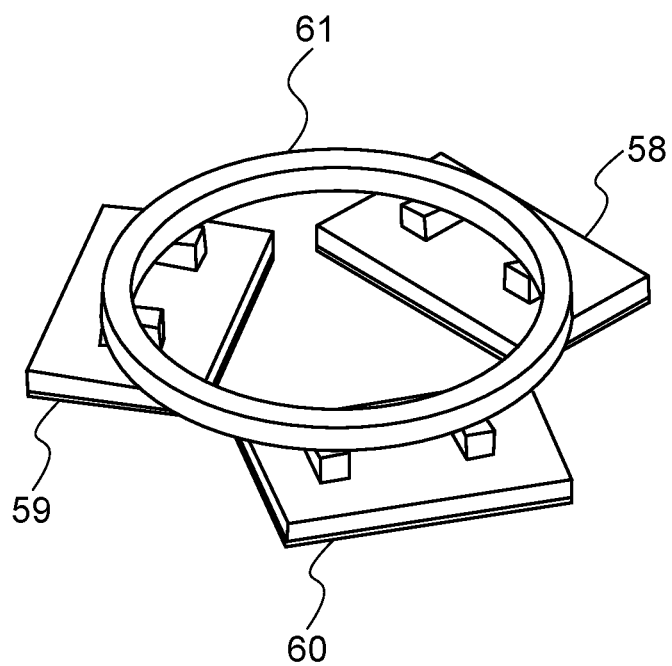
FIG. 23 is a view showing an example of a rotary-motion vibration actuator concerning the third embodiment.

Moreover, a configuration in which a plurality of vibrators in which projections are provided on the same plane are equally arranged along a circumferential direction of a ring-shaped contact member or a circular contact member may be employed. FIG. 23 is a view showing an example of a rotary-motion vibration actuator concerning the third embodiment. As shown in FIG. 23, three vibrators 58, 59, and 60 are equally arranged along a circular contact member 61. The vibrators 58, 59, and 60 are electrically connected in series, and inductors are respectively connected in parallel to the vibrators 58, 59, and 60 for each phase. Although the plurality of vibrators are driving one contact member in the example of FIG. 23, the plurality of vibrators may respectively drive different contact members. Moreover, when the plurality of vibrators are divided into a plurality of vibrator devices, the respective vibrator devices may drive different contact members.

Figure 24:
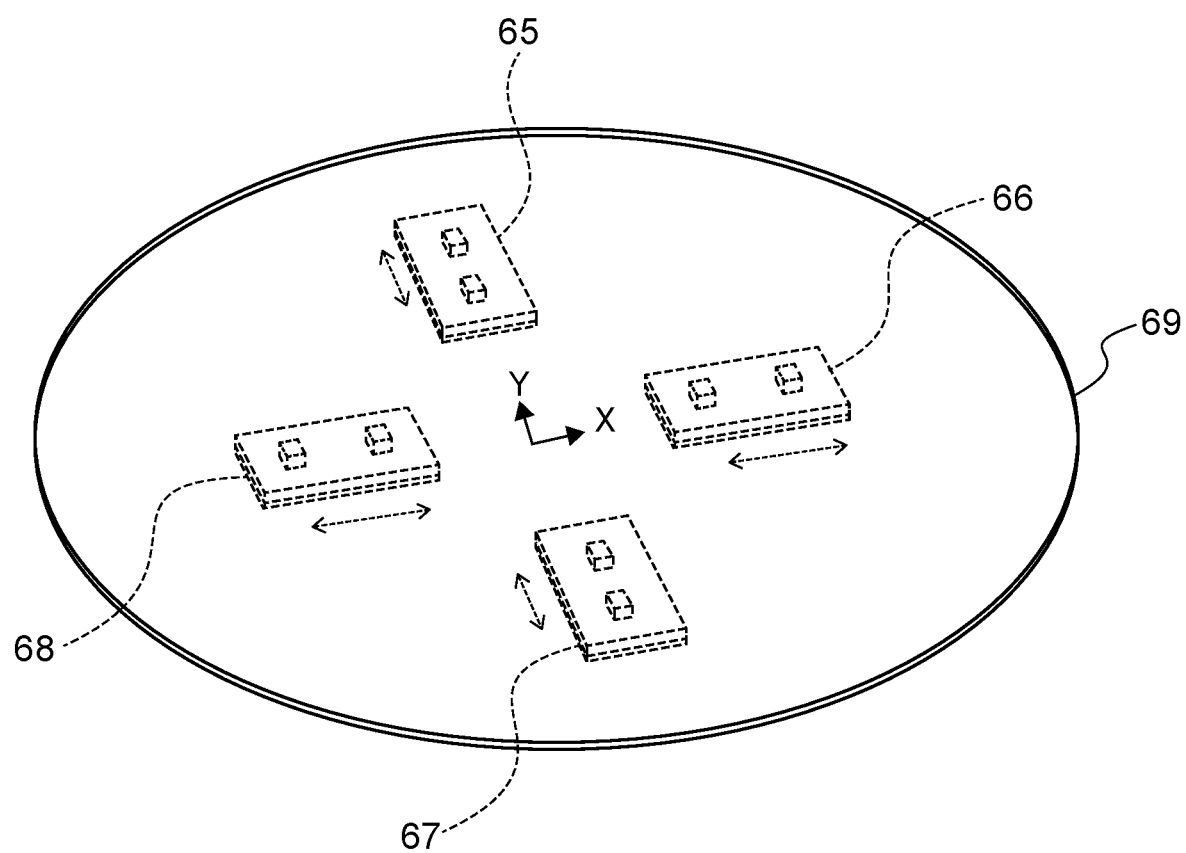
FIG. 24 is a view showing a first example of a vibration actuator concerning a fourth embodiment.

Next, a fourth embodiment will be described. FIG. 24 is a view showing a first example of a vibration actuator concerning the fourth embodiment. As shown in FIG. 24, two vibrators 65 and 67 and two vibrators 66 and 68 respectively constitute vibrator devices. The vibrators 65 and 67 constitute a Y-axis vibrator device that drives a contact member 69 in a Y-axis direction. The vibrators 65 and 67 are electrically connected in series, and inductors are respectively connected in parallel to the vibrators 65 and 67.

The vibrators 66 and 68 constitute an X-axis vibrator device that drives the contact member 69 in an X-axis direction. The vibrators 66 and 68 are electrically connected in series, and inductors are respectively connected in parallel to the vibrators 66 and 68. The resonance frequency of the X-axis vibrator device is fully apart from the resonance frequency of the Y-axis vibrator device so as not to affect mutually. And the shapes of the vibrators are adjusted so that the driving frequency ranges may not overlap.

Figure 25:
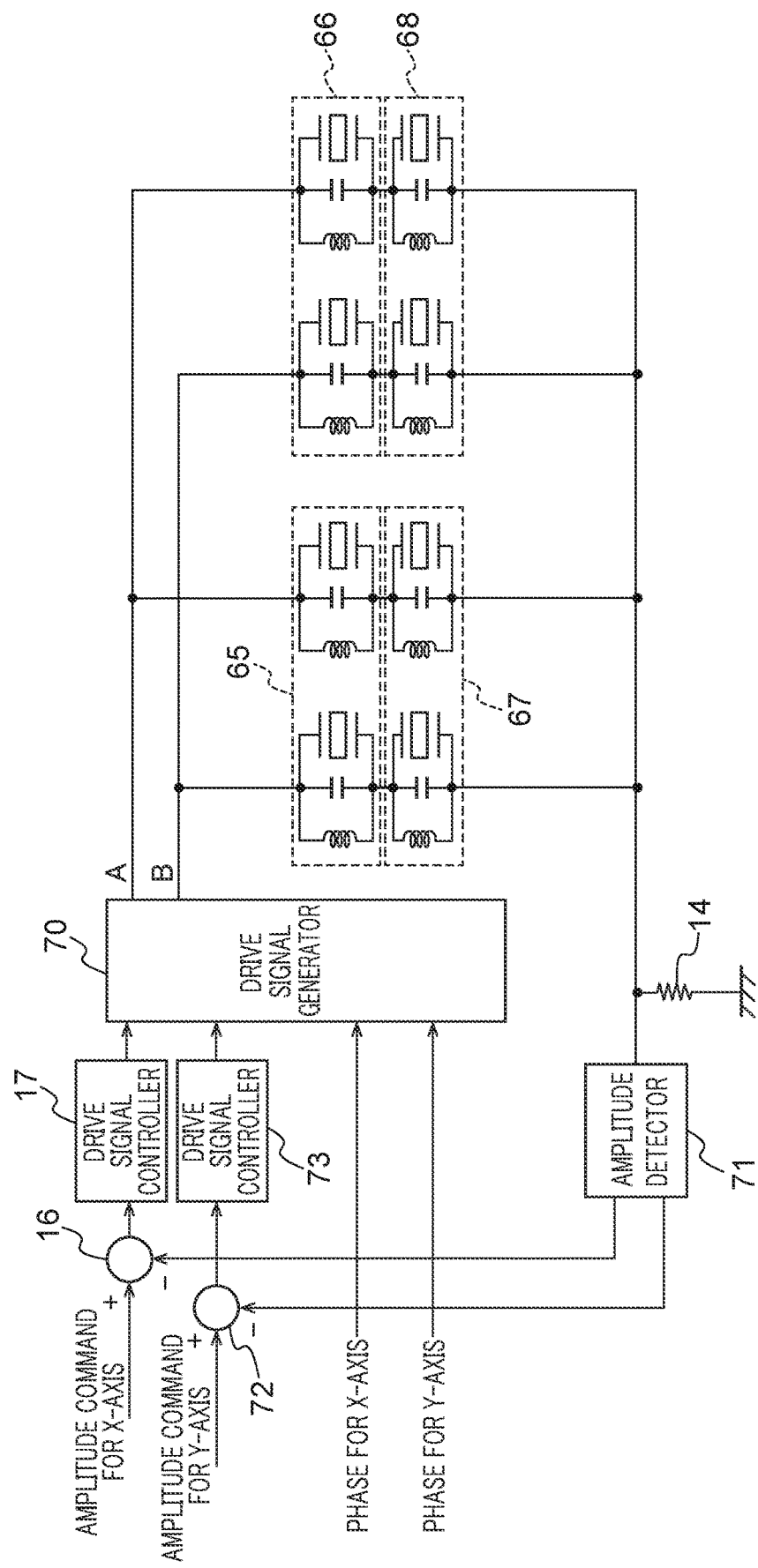
FIG. 25 is a view showing a first example of a drive circuit for the vibration actuator concerning the fourth embodiment.

FIG. 25 is a view showing a first example of a drive circuit for the vibration actuator concerning the fourth embodiment. The vibrators 66 and 68 of the X-axis vibrator device and the vibrators 65 and 67 of the Y-axis vibrator device are connected in series for each phase. Moreover, an inductor and a capacitor are connected in parallel to each vibrator. Values of the inductors and capacitors of the Y-axis vibrator device are subjected to frequency matching to a frequency Fy for a Y-axis. And values of the inductors and capacitors of the X-axis vibrator device are subjected to frequency matching to a frequency Fx for an X-axis.

Figure 26:
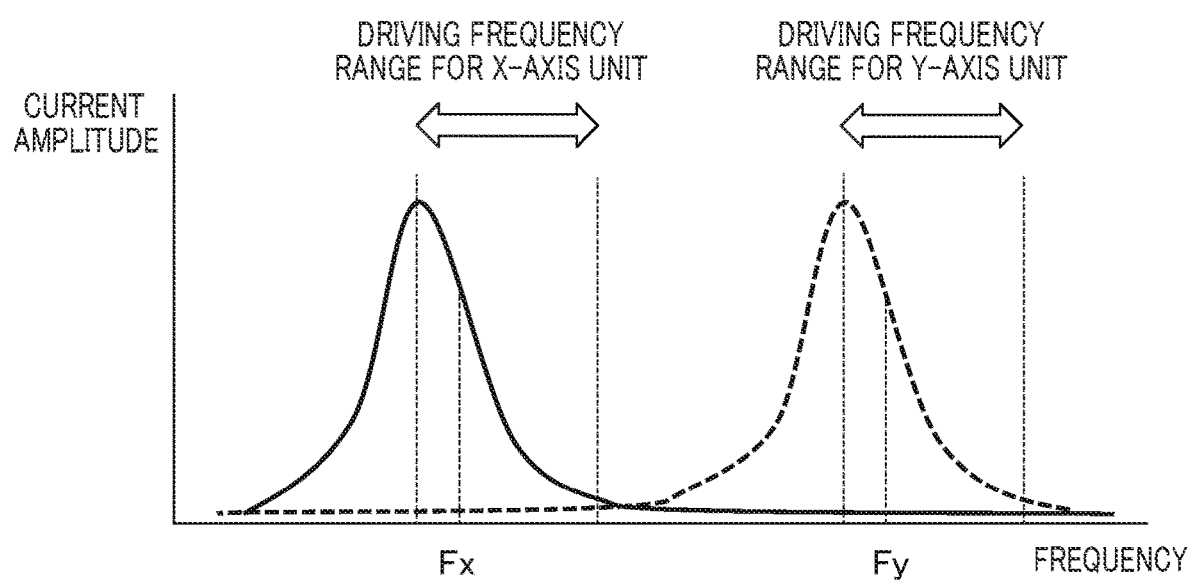
FIG. 26 is a graph showing electric current amplitude characteristics of the vibrator devices in the fourth embodiment.

FIG. 26 is a graph showing electric current amplitude characteristics of the vibrator devices in the fourth embodiment. A solid line shows the vibration characteristic of the X-axis vibrator device, and a broken line shows the vibration characteristic of the Y-axis vibrator device. Driving frequency ranges are set at the higher sides of the respective maximum-amplitude frequencies. The frequency Fx for the X-axis and the frequency Fy for the Y-axis are set within the respective driving frequency ranges.

The drive signal generator 70 in FIG. 25 generates two-phase alternating voltages in the respective frequency ranges by compositing the alternating voltages in the two frequency ranges including the frequency Fx for the X-axis and the frequency Fy for the Y-axis, respectively. An amplitude detector 71 detects the vibration amplitudes in the frequency range for the X-axis and the frequency range for the Y-axis on the basis of the sum signal of the two-phase electric currents that flow according to the vibration velocities of the vibrators that the resistance 14 for current detection measures, and outputs the detection results. Comparators 16 and 72 respectively compare a vibration amplitude command for the X-axis and a vibration amplitude command for the Y-axis from a command unit (not shown) with the detection results that the amplitude detector 71 outputs. Drive signal controllers 17 and 73 respectively control the frequencies of the alternating voltages applied to the X-axis vibrator device and Y-axis vibrator device on the basis of the comparison results of the comparators 16 and 72.

Moreover, the command unit monitors position signals output from a two-dimensional position detector (not shown) that detects a two-dimensional position of the contact member 69. And the command unit compares the position signals with target positions in the respective axes. Then, the command unit switches the phases of the alternating voltages applied to the X-axis vibrator device and Y-axis vibrator device to 90 degrees or −90 degrees according to signs (+/−) of the comparison results and sets up a vibration amplitude command for the X-axis and a vibration amplitude command for the Y-axis according to the absolute values of the comparison results. As a method of separating the signals in the two frequency ranges, there are a method of separating the signals with a filter, a method of finding frequencies and amplitudes by the FFT computation, and a method of performing synchronous detection of the synchronizing signal that the drive signal generator 70 generates.

Moreover, when the respective vibration velocities of the X-axis vibrator device and Y-axis vibrator device are detected from the sum signal of the electric currents, an error occurs in measurement of the amplitudes if the frequencies are merely separated. In view of this problem, an offset value for an amplitude for every frequency obtained beforehand is stored in the amplitude detector 71. This enables detection of a vibration velocity at high accuracy by performing a correction calculation based on the offset value to the obtained information about the amplitude and frequency.

Figure 27:
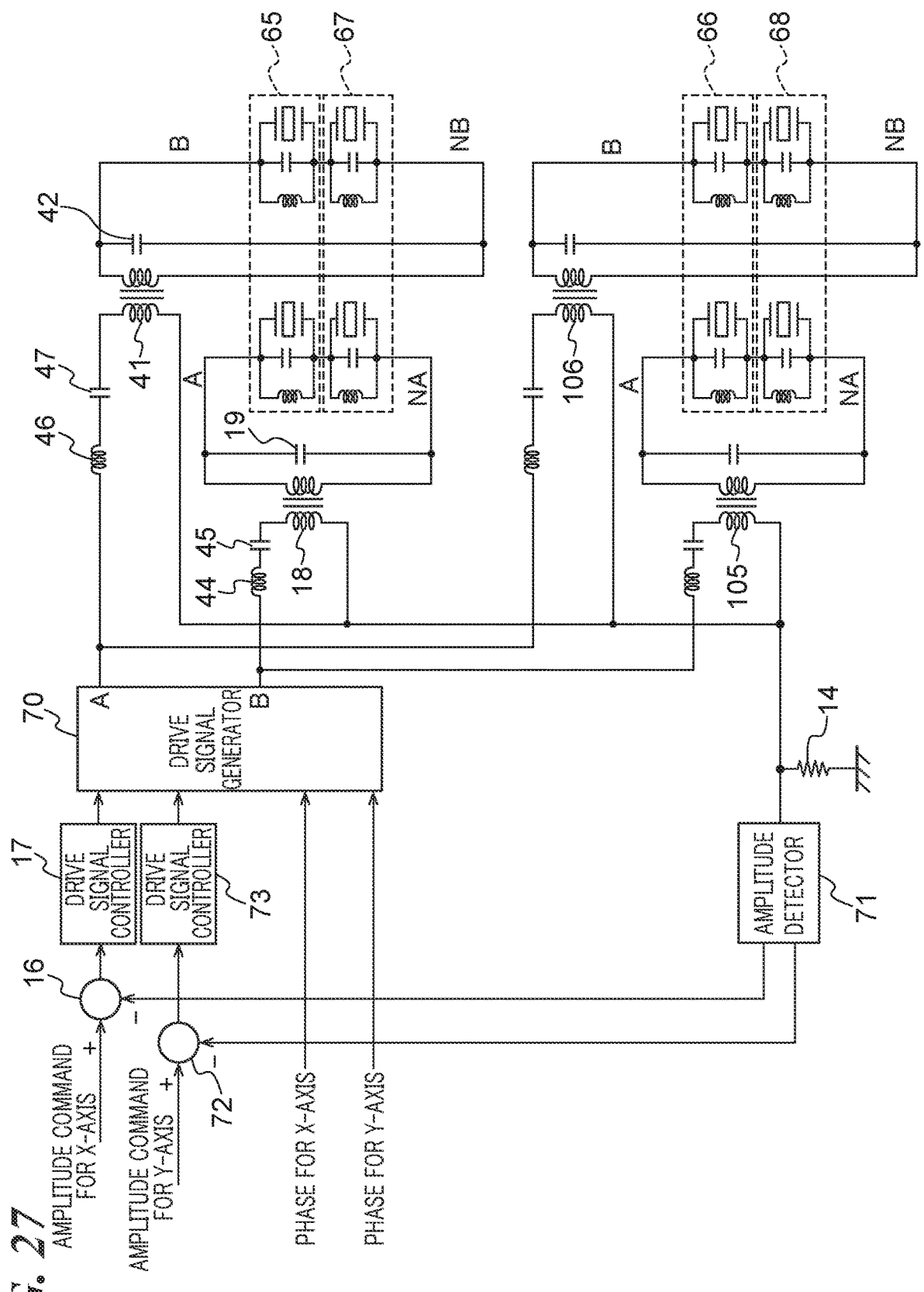
FIG. 27 is a view showing a second example of a drive circuit for the vibration actuator concerning the fourth embodiment.

FIG. 27 is a view showing a second example of a drive circuit for the vibration actuator concerning the fourth embodiment. The vibrator devices of which the driving frequency ranges differ are individually connected to the drive signal generator 70 through the transformers, respectively. A series circuit that consists of an inductor and a capacitor that are subjected to frequency matching at a predetermined frequency within a driving frequency range decided for each vibrator device is inserted between each transformer and the drive signal generator 70.

Figure 28:
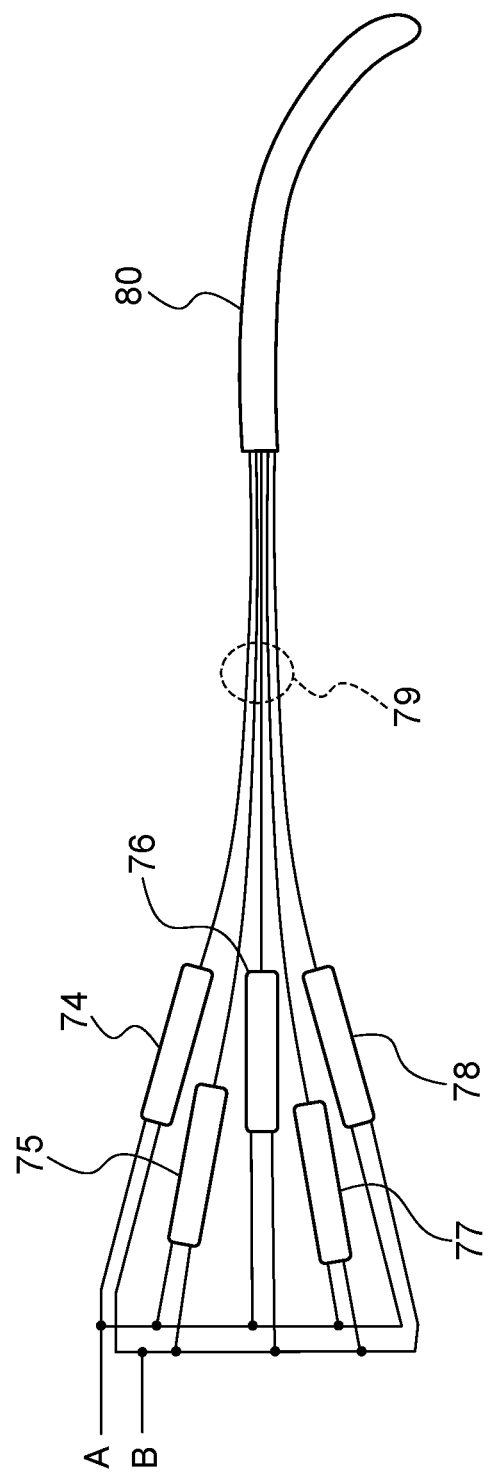
FIG. 28 is a view showing a second example of a vibration actuator concerning the fourth embodiment.

FIG. 28 is a view showing a second example of the vibration actuator concerning the fourth embodiment. A plurality of vibrator devices 74, 75, 76, 77, and 78 shown in FIG. 28 have a plurality of vibrators connected in series and inductors connected in parallel to the respective vibrators.

The vibrator devices 74, 75, 76, 77, and 78 are constituted by having the vibrators of which driving frequency ranges do not overlap, respectively. The vibrator devices 74, 75, 76, 77, and 78 are electrically connected in parallel and are driven by two-phase alternating voltages A and B.

Each of the vibrator devices 74, 75, 76, 77, and 78 nips a linear-motion contact member with a plurality of vibrators that are electrically connected in series as with the examples shown in FIG. 20A, FIG. 20B, FIG. 22A, and FIG. 22B. And a wire bundle 79 is combined with the contact member. The wire bundle 79 is engaged with a tube-shaped bending driver 80 that imitates a finger. The bending driver 80 is constituted so as to bend and stretch a plurality of pseudo joints by pulling and pressing wires of the wire bundle 79. One wire of the wire bundle 79 corresponds to each of the vibrator devices 74, 75, 76, 77, and 78. A wire may be configured to combine with a vibrator device so as to be relatively movable with respect to a contact member. That is, the wire is constituted to be movable by the vibrator device and contact member that move relatively and mutually.

The bending driver 80 can be driven by linearly moving the contact members included in the vibrator devices 74, 75, 76, 77, and 78 as if a finger bends and stretches. Accordingly, since a plurality of wires are driven even if the number of wiring lines is small, it is effective in the driving of a complicated robot hand having a plurality of joints.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-058725, filed Mar. 26, 2019, which is hereby incorporated by reference herein in its entirety.

What is claimed is:

1. A vibration actuator comprising:
a vibrator device; and
a contact member that moves relative to the vibrator device,
wherein the vibrator device comprises:
a plurality of vibrators that are connected in series, and
a plurality of inductors that are connected in parallel with the plurality of vibrators, respectively.

2. The vibration actuator according to claim 1, wherein a capacitor is connected in parallel with an entire set of the plurality of inductors.

3. The vibration actuator according to claim 1, wherein the plurality of vibrators are arranged around the contact member at approximately equal intervals and pressed to the contact member.

4. The vibration actuator according to claim 1, wherein values of the plurality of inductors are matched at a frequency within a predetermined range from a resonance frequency of the vibrator device.

5. The vibration actuator according to claim 1, wherein the plurality of inductors that are respectively connected in parallel with the plurality of vibrators are connected in series.

6. The vibration actuator according to claim 1, further comprising at least one other vibrator device, and
wherein the vibrator device and the at least one other vibrator device are connected in parallel and contact the contact member.

7. The vibration actuator according to claim 5, wherein an average of resonance frequencies of the plurality of vibrators falls within a predetermined frequency range.

8. The vibration actuator according to claim 5, wherein dispersion of resonance frequencies of the plurality of vibrators falls within a predetermined dispersion range.

9. The vibration actuator according to claim 6, wherein driving frequency ranges of the vibrator device and the at least one other vibrator device do not overlap.

10. The vibration actuator according to claim 1, wherein the vibrator device has the plurality of vibrators, each of which has a plurality of vibration sections that are different in a phase of input alternating voltage, and wherein the plurality of vibration sections of the plurality of vibrators are connected in series for every phase and the inductors are connected in parallel to the plurality of vibration sections, respectively.

11. The vibration actuator according to claim 1, wherein the vibrator device is provided with a transformer at an input side.

12. The vibration actuator according to claim 1, further comprising at least one other vibrator device, wherein the vibrator device and the at least one other vibrator device, which drive the same contact member, are respectively provided with transformers at input sides, and wherein winding ratios of the transformers are different.

13. The vibration actuator according to claim 1, further comprising a wire, wherein the wire is movable by the vibrator device and the contact member, which move relatively and mutually.

14. A driving device for a vibration actuator equipped with a vibrator device and a contact member that move relatively and mutually, the driving device comprising:

a drive signal generator that generates an alternating voltage applied to the vibrator device;

an amplitude detector that detects amplitude of an electric current flowing to the vibrator device; and a drive signal controller that controls the alternating voltage that the drive signal generator generates according to the amplitude of the electric current, wherein the vibrator device comprises:

a plurality of vibrators that are connected in series, and a plurality of inductors that are connected in parallel with the plurality of vibrators, respectively.

15. The driving device for the vibration actuator according to claim 14, wherein the amplitude detector detects that failure occurs in the vibrator device in a case where an amount of increase of the electric current is more than a predetermined amount.

16. The driving device for the vibration actuator according to claim 14, wherein the drive signal generator generates an alternating voltage formed of composited alternating voltages of different frequency ranges, wherein the amplitude detector detects the amplitude of the electric current about each of the different frequency ranges, and wherein the drive signal controller controls the alternating voltage that the drive signal generator generates about each of the different frequency ranges.

17. The driving device for the vibration actuator according to claim 14, wherein a transformer is inserted between the drive signal generator and the vibrator device.

18. The driving device for the vibration actuator according to claim 14, wherein the vibration actuator is provided with at least one other vibrator device, wherein transformers are inserted between the drive signal generator and corresponding one of the vibrator device and the at least one other vibrator device, and wherein winding ratios of the transformers are different.

* * * * *